US012751088B2

(12) United States Patent
Son et al.

(10) Patent No.: US 12,751,088 B2
(45) Date of Patent: Sep. 29, 2026

(54) DISPLAY DEVICE

(71) Applicant: Samsung Display Co., LTD., Yongin-si (KR)

(72) Inventors: Yong Duck Son, Yongin-si (KR); Dong Hyun Won, Yongin-si (KR); Yoon Ho Lee, Yongin-si (KR); Hoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 361 days.

(21) Appl. No.: 18/503,735

(22) Filed: Nov. 7, 2023

(65) Prior Publication Data

US 2024/0153967 A1 May 9, 2024

(30) Foreign Application Priority Data

Nov. 9, 2022 (KR) ........................ 10-2022-0148410

(51) Int. Cl.

*H10D 86/60* (2025.01)
*H10D 86/40* (2025.01)
*H10W 90/00* (2026.01)

(52) U.S. Cl.

CPC ........... *H10D 86/60* (2025.01); *H10D 86/441* (2025.01); *H10W 90/00* (2026.01); *H10D 86/411* (2025.01)

(58) Field of Classification Search

CPC ...... H10H 29/39; H10H 29/49; H10K 59/123; H10K 59/131; H10D 86/441–443
See application file for complete search history.

(56) References Cited

U.S. PATENT DOCUMENTS 11,600,240 B2 3/2023 Yokoyama et al.
12,207,515 B2 1/2025 Yoo et al.
2020/0203235 A1* 6/2020 Jung ...................... H10D 86/60
2021/0375700 A1 12/2021 Xiao et al.
2023/0005962 A1* 1/2023 Lee ..................... H01L 25/0753
(Continued)

FOREIGN PATENT DOCUMENTS

CN 113937091 A 1/2022
KR 10-2002-0017322 A 3/2002
(Continued)

OTHER PUBLICATIONS

Korean Office Action for KR Application No. 10-2022-0148410, dated Apr. 13, 2026, 9 pages.

*Primary Examiner* — Evan G Clinton
(74) *Attorney, Agent, or Firm* — Womble Bond Dickinson (US) LLP

(57) ABSTRACT

A display device includes a substrate having a first surface on which a light emitting element is located, a second surface on which a driving unit for driving the light emitting element is located, the second surface being opposite the first surface, and a first side surface between the first surface and the second surface, a first pad on the first surface of the substrate and electrically connected to the light emitting element, a second pad on the second surface of the substrate and electrically connected to the driving unit, and a side wiring on the first surface, the second surface, and the first side surface of the substrate to electrically connect the first pad and the second pad. The side wiring includes a first side wiring and a second side wiring spaced from each other.

20 Claims, 17 Drawing Sheets

(56) References Cited

U.S. PATENT DOCUMENTS

| | | | | |
|---|---|---|---|---|
| 2024/0055442 | A1* | 2/2024 | Ito | H10D 86/60 |
| 2024/0128280 | A1* | 4/2024 | Kim | H10D 86/441 |

FOREIGN PATENT DOCUMENTS

| | | | |
|---|---|---|---|
| KR | 10-2020-0110491 | A | 9/2020 |
| KR | 10-2020-0145809 | A | 12/2020 |
| KR | 10-2344277 | B1 | 12/2021 |
| KR | 10-2022-0096888 | A | 7/2022 |

* cited by examiner

200: 210, 220
210: 210a, 210b, 210c, 210d
220: 220a, 220b, 220c, 220d

CNE: CNEa, CNEb
200: 210, 220
POP1: POP1a, POP1b

PAD2: PAD2a, PAD2b
BCL: BCLa, BCLb
200: 210, 220
POP2: POP2a, POP2b

DISPLAY DEVICE

CROSS-REFERENCE TO RELATED APPLICATION

This application claims priority to and the benefit of Korean Patent Application No. 10-2022-0148410, filed on Nov. 9, 2022, in the Korean Intellectual Property Office (KIPO), the entire content of which is incorporated by reference herein.

BACKGROUND

1. Field

One or more embodiments of the present disclosure relate to a display device and a tiled display device.

2. Description of the Related Art

The importance of a display device is increasing with the development of multimedia. Accordingly, various types of display devices such as an organic light emitting diode (OLED) display and a liquid crystal display (LCD) are being used.

A display device includes a display area capable of expressing various colors while being operated in units of pixels or sub-pixels and a bezel area in which lines for driving the pixels or the sub-pixels are disposed.

Recently, there is an increasing demand for bezel-less technology that reduces or eliminates the bezel area to increase or maximize the display area in the display device. Accordingly, research and development on side wiring formation technology for forming a line on a side surface of a substrate is steadily progressing.

SUMMARY

Aspects and features of embodiments of the present disclosure provide a display device capable of having improved device reliability.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a substrate having a first surface on which a light emitting element is located, a second surface on which a driving unit for driving the light emitting element is located, the second surface being opposite the first surface, and a first side surface between the first surface and the second surface, a first pad on the first surface of the substrate and electrically connected to the light emitting element, a second pad on the second surface of the substrate and electrically connected to the driving unit, and a side wiring on the first surface, the second surface, and the first side surface of the substrate to electrically connect the first pad and the second pad. The side wiring includes a first side wiring and a second side wiring spaced from each other. The first pad includes a first contact portion in contact with the first side wiring, and a second contact portion on one side of the first contact portion and in contact with the second side wiring.

The display device may further include a top connection line between the first surface of the substrate and the first pad and electrically connecting the first pad and the light emitting element, and an upper insulating layer between the top connection line and the first pad. The first pad is in contact with the top connection line through a plurality of contact holes penetrating through the upper insulating layer.

The first pad may further include a first inspection portion on an other side of the first contact portion and not overlapping the side wiring.

The second pad may include a third contact portion in contact with the first side wiring, and a fourth contact portion on one side of the third contact portion and being in contact with the second side wiring.

The display device may further include a bottom connection line between the second surface of the substrate and the second pad and electrically connecting the second pad and the driving unit. The second pad may be in contact with the bottom connection line.

The second pad may further include a second inspection portion on an other side of the third contact portion and not overlapping the side wiring.

The substrate may further include a first chamfered surface extending from one side of the first surface, and a second chamfered surface extending from one side of the second surface. The first side surface may connect the first chamfered surface and the second chamfered surface.

The side wiring may be on the first surface, the first chamfered surface, the first side surface, the second chamfered surface, and the second surface.

The side wiring may include silver (Ag).

The light emitting element may be a flip chip type micro light emitting diode element.

According to one or more embodiments of the present disclosure, there is provided a display device having a substrate including a first surface on which a light emitting element is located and a second surface on which a driving unit for driving the light emitting element located, the second surface being opposite opposing the first surface, a first upper pad electrode on the first surface of the substrate and electrically connected to the light emitting element, a first insulating layer on the first upper pad electrode and having a first opening and a second opening exposing the first upper pad electrode, a first lower pad electrode on the second surface of the substrate and electrically connected to the driving unit, a second insulating layer on the first lower pad electrode and having a third opening and a fourth opening exposing the first lower pad electrode, and a side wiring electrically connecting the first upper pad electrode and the first lower pad electrode. The side wiring include a first side wiring in contact with a portion of the first upper pad electrode exposed by the first opening and a portion of the first lower pad electrode exposed by the third opening, and a second side wiring spaced from the first side wiring and in contact with a portion of the first upper pad electrode exposed by the second opening and a portion of the first lower pad electrode exposed by the fourth opening.

The display device may further include an overcoat layer covering the first side wiring and the second side wiring. The overcoat layer may be in contact with the first insulating layer in a separation space between the first side wiring and the second side wiring on the first surface of the substrate.

The overcoat layer may be in contact with the second insulating layer in a separation space between the first side wiring and the second side wiring on the second surface.

The side wiring may include silver (Ag). The overcoat layer may include one or more selected from among an acrylic resin, an epoxy resin, a phenolic resin, a polyamide resin, and a polyimide resin.

The substrate may further include a first chamfered surface extending from one side of the first surface, a second chamfered surface extending from one side of the second surface, and a first side surface connecting the first chamfered surface and the second chamfered surface. The side wiring may be on the first surface, the first chamfered surface, the first side surface, the second chamfered surface, and the second surface.

According to one or more embodiments of the present disclosure, there is provided a tiled display device including a plurality of display devices and a connecting portion between the plurality of display devices. A first display device of the plurality of display devices includes a substrate having a first surface on which a light emitting element is located, a second surface on which a driving unit for driving the light emitting element is located, the second surface being opposite the first surface, and a first side surface between the first surface and the second surface, a first pad on the first surface of the substrate and electrically connected to the light emitting element, a second pad on the second surface of the substrate and electrically connected to the driving unit, and a side wiring on the first surface, the second surface, and the first side surface of the substrate to electrically connect the first pad and the second pad. The side wiring includes a first side wiring and a second side wiring spaced from each other. The first pad includes a first inspection portion that does not overlap the side wiring, a first contact portion on one side of the first inspection portion and in contact with the first side wiring, and a second contact portion on one side of the first contact portion and in contact with the second side wiring.

The light emitting element may be a flip chip type micro light emitting diode element.

The substrate may include glass.

The first display device may include a bottom connection line on the second surface of the substrate and connected to the second pad, and a flexible film connected to the bottom connection line through a conductive adhesive member.

The plurality of display devices may be arranged in a matrix form in M rows and N columns, wherein M and N are positive integers.

According to the aforementioned and other embodiments of the present disclosure, the display device according to an exemplary embodiment may have improved device reliability.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
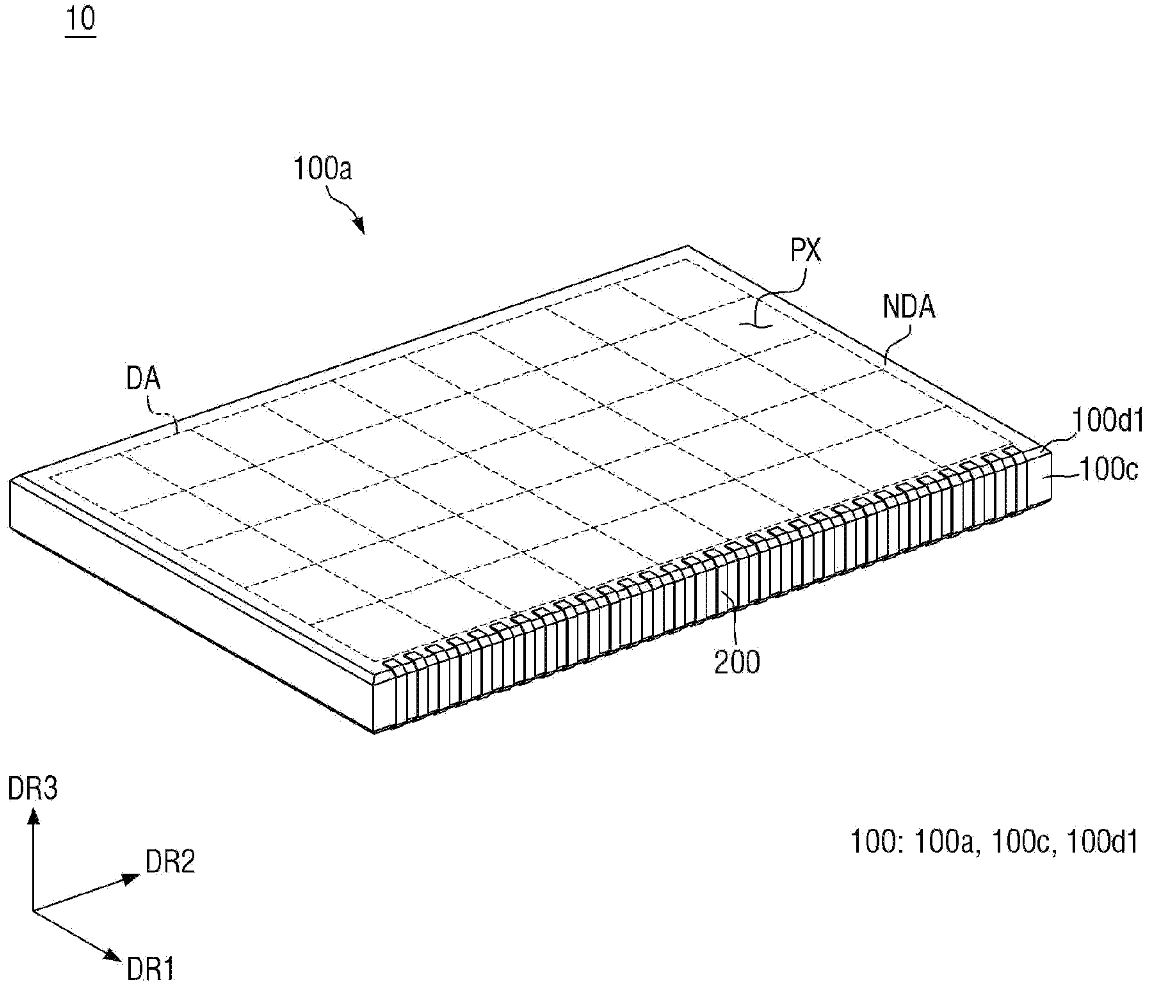
FIG. 1 is a perspective view illustrating a front surface of a display device according to one or more embodiments.

Aspects and features of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure might not be described.

Unless otherwise noted, like reference numerals, characters, or combinations thereof denote like elements throughout the attached drawings and the written description, and thus, descriptions thereof will not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the embodiments of the present disclosure. Thus, embodiments disclosed herein should not be construed as limited to the particular illustrated shapes of regions, but are to include deviations in shapes that result from, for instance, manufacturing.

For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit and/or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "in a plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of the present disclosure, expressions such as "at least one of," "one of," and "selected from," when preceding a list of elements, modify the entire list of elements and do not modify the individual elements of the list. For example, "at least one of X, Y, and Z," "at least one of X, Y, or Z," "at least one selected from the group consisting of X, Y, and Z," and "one or more selected from among X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B. Further, the use of "may" when describing embodiments of the present disclosure refers to "one or more embodiments of the present disclosure".

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, for example, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning for example consistent with their meaning in the context of the relevant art and/or the present specification, and should not be interpreted in an idealized or overly formal sense, unless expressly so defined herein.

Figure 2:
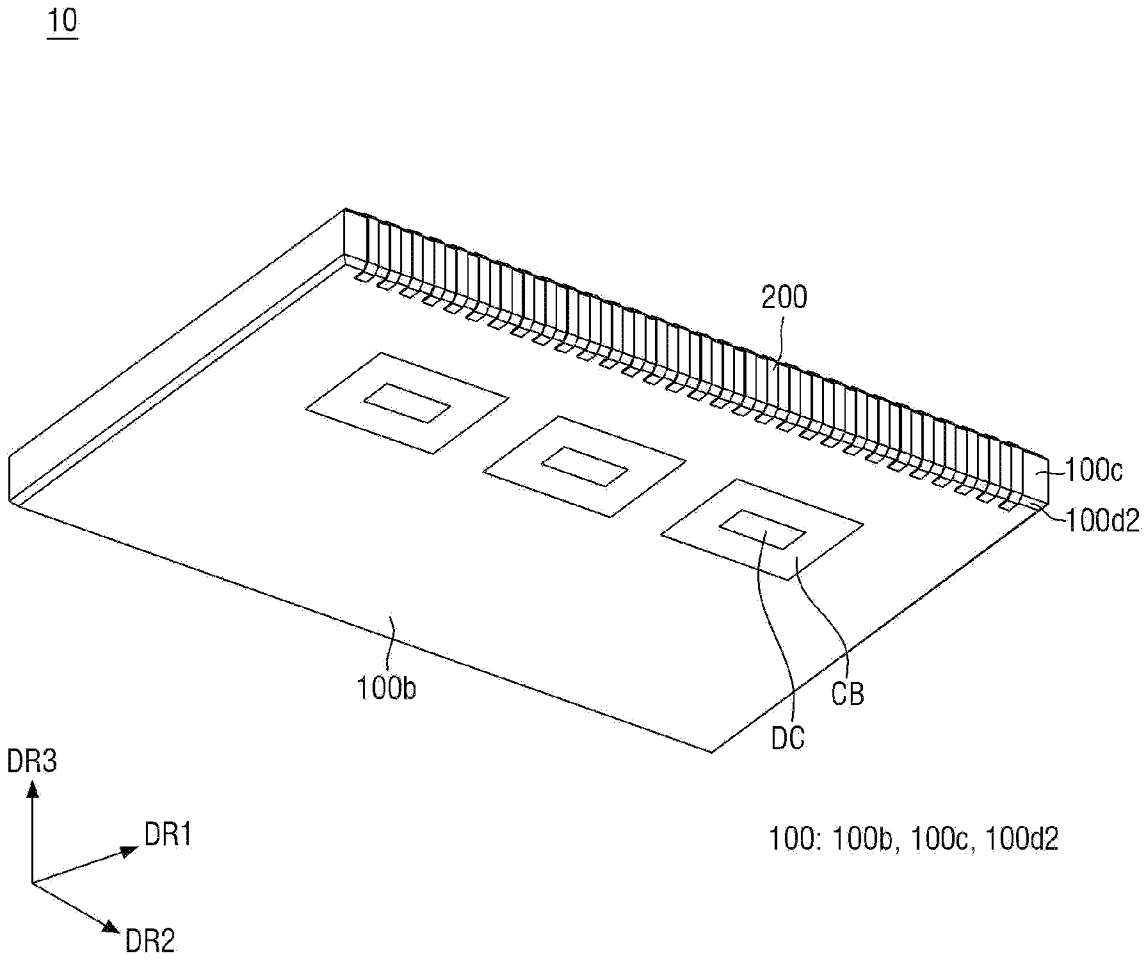
FIG. 2 is a perspective view illustrating a rear surface of the display device according to one or more embodiments.

FIG. 1 is a perspective view illustrating a front surface of a display device according to one or more embodiments. FIG. 2 is a perspective view illustrating a rear surface of the display device according to one or more embodiments.

In FIG. 1, a first direction DR1, a second direction DR2, and a third direction DR3 are defined. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 refers to a vertical direction in the drawings, the second direction DR2 refers to a horizontal direction in the drawings, and the third direction DR3 refers to upper and lower directions in the drawings, that is, a thickness direction.

In the following specification, unless otherwise specified, the term "direction" may refer to both directions toward both sides extending along the direction. In addition, when both "directions" extending to both sides need to be distinguished from each other, one side will be referred to as "one side in the direction" and the other side will be referred to as "the other side in the direction". In FIG. 1, an arrow direction will be referred to as one side, and an opposite direction to the arrow direction will be referred to as the other side.

Hereinafter, for convenience of explanation, in referring to surfaces of a display device 10 or each member constituting the display device 10, one surface facing one side in a direction in which an image is displayed, that is, the third direction DR3 is referred to as a top surface, and the other surface, which is an opposite surface of the one surface, is referred to as a bottom surface. However, the present disclosure is not limited thereto, and the one surface and the other surface of the member may be referred to as a front surface and a rear surface, respectively, or may also be referred to as a first surface or a second surface. In addition, in describing a relative position of each member of the display device 10, one side in the third direction DR3 may be referred to as an upper side and the other side in the third direction DR3 may be referred to as a lower side.

Referring to FIGS. 1 and 2, a display device 10 according to one or more embodiments may be applied to portable electronic devices such as mobile phones, smartphones, tablet personal computers (PCs), mobile communication terminals, electronic notebooks, electronic books, portable multimedia players (PMPs), navigation devices, and/or ultra mobile PCs (UMPCs). Alternatively, the display device 10 according to one or more embodiments may be applied as a display unit of a television, a laptop computer, a monitor, a billboard, and/or the Internet of Things (IOT).

The display device 10 may be formed in a planar shape similar to a quadrangle. For example, the display device 10 may have a planar shape similar to a quadrangle having a short side in a first direction DR1 and a long side in a second direction DR2 as illustrated in FIG. 1. A corner where the short side in the first direction DR1 and the long side in the second direction DR2 meet may be rounded to have a suitable curvature (e.g., a predetermined curvature) or may be formed at a right angle. The planar shape of the display device 10 is not limited to the quadrangle, and may also be formed similarly to other polygons, circles, or ovals.

The display device 10 may include a display area DA in which an image is displayed on one side surface (hereinafter referred to as 'top surface') in the third direction DR3, and may include a non-display area NDA in which an image is not displayed, as an area other than the display area DA. Specifically, the non-display area NDA may be disposed on a portion of the top surface of the display device 10, both side surfaces of the display device 10 in the second direction DR2 (hereinafter, referred to as 'side surfaces'), both side surfaces of the display device 10 in the first direction DR1, and the other side surface of the display device 10 in the third direction DR3 (hereinafter, referred to as a 'bottom surface'), but is not limited thereto. In one or more embodiments, the non-display area NDA may be disposed around (e.g., to surround) an edge of the display area DA, but is not limited thereto. In one or more embodiments, the display area DA and the non-display area NDA of the display device 10 may also be applied to a substrate 100 to be described later.

The display device 10 according to one or more embodiments includes a substrate 100, a plurality of pixels PX, a plurality of side wirings 200, and a driving unit, and the driving unit may include a circuit board CB and a display driving circuit DC.

The substrate 100 may serve as a base of the display device 10. In one or more embodiments, the substrate 100, which is a rigid substrate having rigidity, may include glass, but is not limited thereto. For example, the substrate 100, which is a flexible substrate having flexibility, may also include polyimide. Hereinafter, for convenience of explanation, the substrate 100, which is a rigid substrate, will be mainly described as including glass.

The substrate 100 may have a three-dimensional shape similar to a rectangular parallelepiped, and may have a shape in which corners formed by the top and side surfaces of the rectangular parallelepiped and corners formed by the bottom and side surfaces of the rectangular parallelepiped are bent. In other words, the substrate 100 may have a three-dimensional shape similar to a rectangular parallelepiped, and may have a shape in which edges of the top and bottom surfaces thereof are bent. It is illustrated in FIGS. 1 and 2 that chamfered surfaces are formed on both sides of the top and bottom surfaces of the substrate 100 in the first direction DR1 and in the second direction DR2, respectively. In one or more embodiments, the substrate 100 may have surfaces on which the corners are bent, that is, the chamfered surfaces that are formed on both sides of the top and bottom surfaces of the substrate 100 in the first direction DR1 and in the second direction DR2, respectively, but is not limited thereto. For example, the chamfered surface may also be formed on only one side of the top and bottom surfaces of the substrate 100 in the first direction DR1. Hereinafter, for convenience of explanation, it will be mainly described that the chamfered surfaces are formed on both sides of the top and bottom surfaces of the substrate 100 in the first direction DR1 and in the second direction DR2, respectively.

The substrate 100 may include a first surface 100*a*, a second surface 100*b*, a plurality of chamfered surfaces, and a plurality of side surfaces.

The first surface 100*a* may be the top surface of the substrate 100. The first surface 100*a* may have a rectangular shape having a short side in the first direction DR1 and a long side in the second direction DR2.

The second surface 100*b* may be a surface opposite the first surface 100*a* in the third direction DR3. The second surface 100*b* may be the bottom surface of the substrate 100. The second surface 100*b* may have a rectangular shape having a short side in the first direction DR1 and a long side in the second direction DR2.

The plurality of side surfaces are surfaces disposed between the first surface 100*a* and the second surface 100*b*, and may be both side surfaces of the substrate 100 in the first direction DR1 and both sides of the substrate 100 in the second direction DR2. For convenience of explanation, a side surface disposed on one side in the first direction DR1 from among the plurality of side surfaces is referred to as a 'first side surface 100*c*', a side surface disposed on one side in the second direction DR2 is referred to as a 'second side surface', a side surface disposed on the other side in the first direction DR1 is referred to as a 'third side surface', and a side surface disposed on the other side in the second direction DR2 is referred to as a 'fourth side surface'.

The plurality of chamfered surfaces may refer to surfaces that are disposed between the first surface 100*a* and the plurality of side surfaces and between the second surface 100*b* and the plurality of side surfaces and are obliquely cut in order to prevent chipping defects from occurring in the plurality of side wirings 200. The plurality of chamfered surfaces may smooth a bending angle of each of the plurality of side wirings 200, thereby preventing chipping or cracking of the plurality of side wirings 200 from occurring.

For convenience of explanation, the chamfered surface disposed between the first surface 100*a* and the first side surface 100*c* from among the plurality of chamfered surfaces is referred to as a 'first chamfered surface 100*d*1', the chamfered surface disposed between the second surface 100*b* and the first side surface 100*c* is referred to as a 'second chamfered surface 100*d*2', the chamfered surface disposed between the first surface 100*a* and the second side surface is referred to as a 'third chamfered surface', the chamfered surface disposed between the second surface 100*b* and the second side surface is referred to as a 'fourth chamfered surface', the chamfered surface disposed between the first surface 100*a* and the third side surface is referred to as a 'fifth chamfered surface', the chamfered surface disposed between the second surface 100*b* and the third side surface is referred to as a 'sixth chamfered surface', the chamfered surface disposed between the first surface 100*a* and the fourth side surface is referred to as a 'seventh chamfered surface', and the chamfered surface disposed between the second surface 100*b* and the fourth side surface is referred to as an 'eighth chamfered surface'.

Specifically, the first chamfered surface 100*d*1 may extend from one side of the first surface 100*a* in the first direction DR1, the second chamfered surface 100*d*2 may extend from one side of the second surface 100*b* in the first direction DR1, and the first side surface 100*c* may connect the first chamfered surface 100*d*1 and the second chamfered surface 100*d*2. The third chamfered surface may extend from one side of the first surface 100*a* in the second direction DR2, the fourth chamfered surface may extend from one side of the second surface 100*b* in the second direction DR2, and the second side surface may connect the third chamfered surface and the fourth chamfered surface. The fifth chamfered surface may extend from the other side of the first surface 100*a* in the first direction DR1, the sixth chamfered surface may extend from the other side of the second surface 100*b* in the first direction DR1, and the third side surface may connect the fifth chamfered surface and the sixth chamfered surface. The seventh chamfered surface may extend from the other side of the first surface 100*a* in the second direction DR2, the eighth chamfered surface may extend from the other side of the second surface 100*b* in the second direction DR2, and the fourth side surface may connect the seventh chamfered surface and the eighth chamfered surface.

The plurality of pixels PX may be disposed on the first surface 100*a* of the substrate 100 to display an image. The plurality of pixels PX may be arranged in a matrix form along the first direction DR1 and the second direction DR2. For example, the plurality of pixels PX may be arranged along rows and columns of a matrix along the first direction DR1 and the second direction DR2. A detailed description of a structure of the plurality of pixels PX will be described later.

Each of the plurality of side wirings 200 serves to connect a first pad PAD1 (see FIG. 7) disposed on the first surface 100*a* and a second pad PAD2 (see FIG. 8) disposed on the second surface 100*b*. The first pads PAD1 may be connected to data lines connected to the plurality of pixels PX disposed on the first surface 100*a* of the substrate 100. The plurality of side wirings 200 may be arranged to be spaced from each other in the second direction DR2.

The plurality of side wirings 200 may be disposed on the first surface 100*a*, the second surface 100*b*, at least two chamfered surfaces from among the plurality of chamfered surfaces, and at least one side surface from among the plurality of side surfaces. For example, the plurality of side wirings 200 may be disposed on the first surface 100*a*, the second surface 100*b*, the first chamfered surface 100*d*1, the second chamfered surface 100*d*2, and the first side surface 100*c* to connect the first pads PAD1 disposed on one side of the first surface 100*a* of the substrate 100 in the first direction DR1 and the second pads PAD2 disposed on one side of the second surface 100*b* in the first direction DR1 as illustrated in FIGS. 1 and 2. A detailed description of a shape of each of the plurality of side wirings 200 will be described later.

In one or more embodiments, the plurality of side wirings 200 may be disposed on only one side of the substrate 100 in the first direction DR1, but are not limited thereto. For example, the plurality of side wirings 200 may also be disposed on the other side of the substrate 100 in the first direction DR1, one side of the substrate 100 in the second direction DR2, or the other side of the substrate 100 in the second direction DR2.

In this case, the first pads PAD1 disposed on the first surface 100*a* of the substrate 100 may also additionally disposed on the other side of the substrate 100 in the first direction DR1, one side of the substrate 100 in the second direction DR2, or the other side of the substrate 100 in the second direction DR2, and the second pads PAD2 disposed on the second surface 100*b* of the substrate 100 may also additionally disposed on the other side of the substrate 100 in the first direction DR1, one side of the substrate 100 in the second direction DR2, or the other side of the substrate 100 in the second direction DR2.

FIGS. 1 and 2 illustrate that the plurality of side wirings 200 are disposed on only one side of the substrate 100 in the first direction DR1. Hereinafter, for convenience of explanation, it will be mainly described that the plurality of side wirings 200 are disposed on only one side of the substrate 100 in the first direction DR1.

The circuit boards CB may be disposed on the second surface 100*b* of the substrate 100. Each of the circuit boards CB may be connected to third pads PAD3 (see FIG. 8) disposed on the second surface 100*b* of the substrate 100 using a conductive adhesive member such as an anisotropic conductive film. As will be described later, because the third pads PAD3 are electrically connected to the second pads PAD2, the circuit board CB may be electrically connected to the first pads PAD1 through the side wirings 200. The circuit boards CB may be a flexible film such as a flexible printed circuit board, a printed circuit board, or a chip on film.

The display driving circuit DC may generate data voltages and may supply the data voltage to the data lines extending from the pixels PX through the circuit board CB, the third pads PAD3, the second pads PAD2, the plurality of side wirings 200, and the first pads PAD1. The display driving circuit DC may be formed as an integrated circuit (IC) and attached to the circuit board CB. Alternatively, the display driving circuit DC may be directly attached to the second surface 100*b* of the substrate 100 in a chip on glass (COG) method.

Because the flexible film bent along the side surface of the substrate 100 may be omitted by using the plurality of side wirings 200 to connect the first pads PAD1 disposed on the first surface 100*a* and the second pads PAD2 disposed on the second surface 100*b* as described above, a bezel-less display device 10 in which the non-display area NDA is reduced or minimized may be implemented.

Hereinafter, a structure of the pixel PX of the display device 10 according to one or more embodiments will be described.

Figure 3:
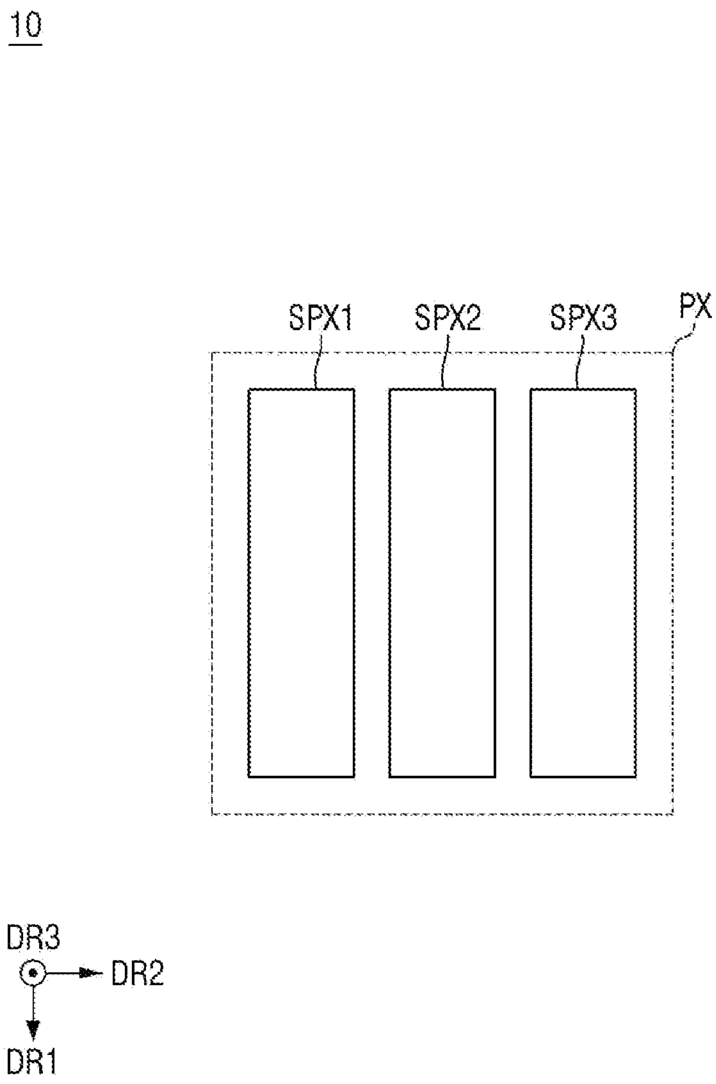
FIG. 3 is a view schematically illustrating a structure of a pixel of the display device according to one or more embodiments.
Figure 4:
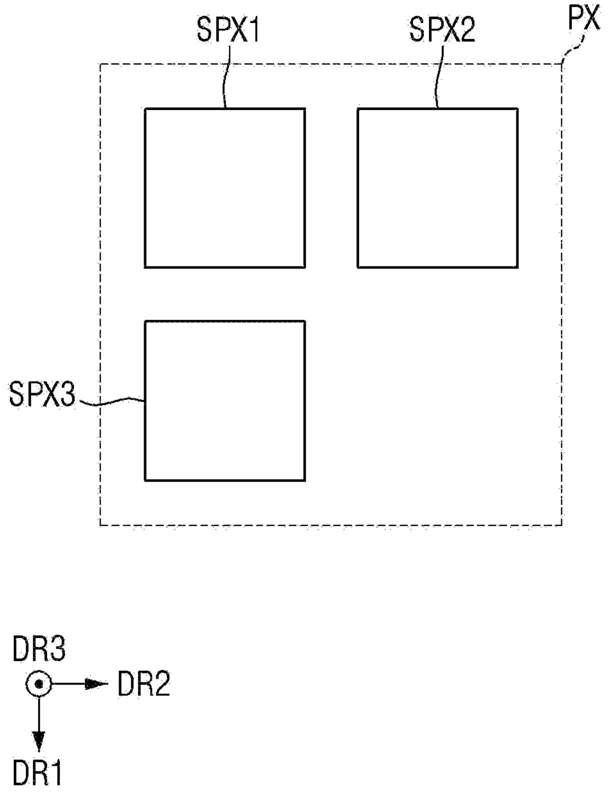
FIG. 4 is a view schematically illustrating a structure of a pixel of a display device according to one or more embodiments.
Figure 5:
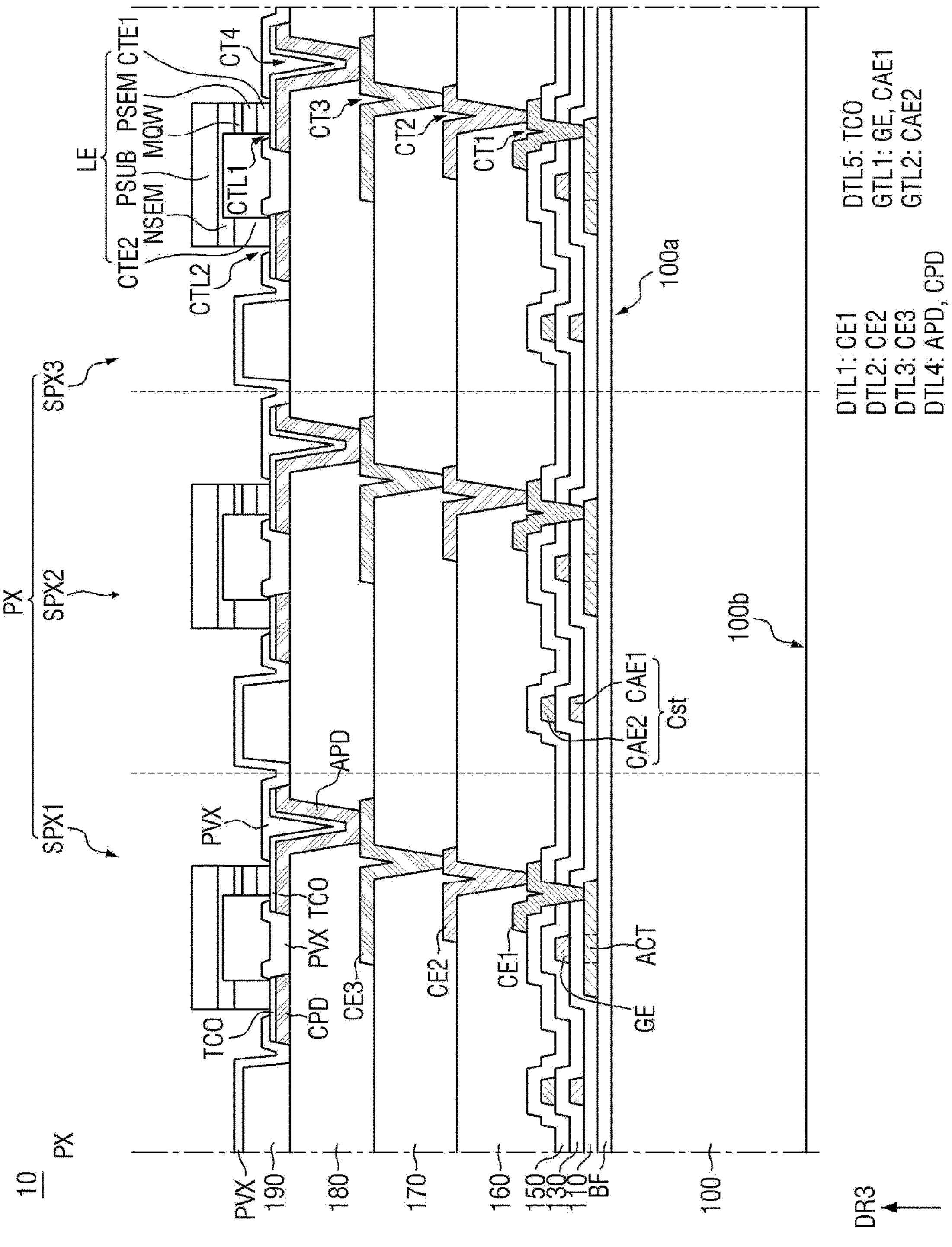
FIG. 5 is a structural view schematically illustrating an example of a cross-sectional structure of a pixel according to one or more embodiments.

FIG. 3 is a view schematically illustrating a structure of a pixel of the display device according to one or more embodiments. FIG. 4 is a view schematically illustrating a structure of a pixel of a display device according to one or more embodiments. FIG. 5 is a structural view schematically illustrating an example of a cross-sectional structure of a pixel according to one or more embodiments.

Referring to FIGS. 3 and 4, each of the pixels PX may include a plurality of sub-pixels. Although it is illustrated in FIGS. 3 and 4 that each of the pixels PX includes three sub-pixels SPX1, SPX2, and SPX3, that is, a first sub-pixel SPX1, a second sub-pixel SPX2, and a third sub-pixel SPX3, the number of the sub-pixels is not limited thereto. Each of the first sub-pixel SPX1, the second sub-pixel SPX2, and the third sub-pixel SPX3 may be connected to any one of the data lines and at least one of the scan lines.

Each of the first sub-pixel SPX1, the second sub-pixel SPX2, and the third sub-pixel SPX3 may have a rectangular, square, or rhombus planar shape. For example, each of the first sub-pixel SPX1, the second sub-pixel SPX2, and the third sub-pixel SPX3 may have a rectangular planar shape having a long side in the first direction DR1 and a short side in the second direction DR2 as illustrated in FIG. 3. Alternatively, each of the first sub-pixel SPX1, the second sub-pixel SPX2, and the third sub-pixel SPX3 may also have a square or rhombus planar shape including sides having the same length in the first direction DR1 and the second direction DR2 as illustrated in FIG. 4.

The first sub-pixel SPX1, the second sub-pixel SPX2, and the third sub-pixel SPX3 may be arranged along the second direction DR2. Alternatively, any one of the second sub-pixel SPX2 and the third sub-pixel SPX3, and the first sub-pixel SPX1 may be arranged along the second direction DR2, and the other one of the second sub-pixel SPX2 and the third sub-pixel SPX3, and the first sub-pixel SPX1 may be arranged along the first direction DR1. For example, as illustrated in FIG. 4, the first sub-pixel SPX1 and the second sub-pixel SPX2 may be arranged along the first direction DR1, and the first sub-pixel SPX1 and the third sub-pixel SPX3 may be arranged along the second direction DR2.

The first sub-pixel SPX1 may emit first light, the second sub-pixel SPX2 may emit second light, and the third sub-pixel SPX3 may emit third light. In this case, the first light may be light of a red wavelength band, the second light may be light of a green wavelength band, and the third light may be light of a blue wavelength band. The red wavelength band may be a wavelength band of approximately 600 nm to 750 nm, the green wavelength band may be a wavelength band of approximately 480 nm to 560 nm, and the blue wavelength band may be a wavelength band of approximately 370 nm to 460 nm, but one or more embodiments of the present disclosure are not limited thereto.

Each of the first sub-pixel SPX1, the second sub-pixel SPX2, and the third sub-pixel SPX3 may include an inorganic light emitting element having an inorganic semiconductor as a light emitting element LE (see FIG. 5) that emits light. For example, the inorganic light emitting element may be a flip chip type micro light emitting diode (LED), but is not limited thereto.

As illustrated in FIGS. 3 and 4, an area of the first sub-pixel SPX1, an area of the second sub-pixel SPX2, and an area of the third sub-pixel SPX3 may be substantially the same, but are not limited thereto. For example, the area of the first sub-pixel SPX1, the area of the second sub-pixel SPX2, and the area of the third sub-pixel SPX3 may be different from each other.

Referring to FIG. 5, each of the plurality of sub-pixels SPX1, SPX2, and SPX3 constituting the pixel PX may include a plurality of conductive layers, a plurality of insulating layers, and a plurality of light emitting elements LE. The plurality of conductive layers and the plurality of insulating layers may form a transistor layer that transmits an electrical signal to the light emitting element LE.

The plurality of sub-pixels disposed on the substrate 100 include an active layer ACT, a first gate metal layer GTL1, a second gate metal layer GTL2, a first data metal layer DTL1, a second data metal layer DTL2, a third data metal layer DTL3, a fourth data metal layer DTL4, and a fifth data metal layer DTL5 as the plurality of conductive layers. In addition, the plurality of pixels PX include a buffer layer BF, a gate insulating layer 110, a first interlayer insulating layer 130, a second interlayer insulating layer 150, and an upper via layer, and the upper via layer includes a first via layer 160, a second via layer 170, a third via layer 180, and a fourth via layer 190.

The substrate 100 may serve to form a base of the display device 10 and may be a base substrate or a base member for supporting a plurality of pixels PX. As described above, the substrate 100 may be a rigid substrate made of glass.

A buffer layer BF may be disposed on the top surface of the substrate 100, that is, on the first surface 100*a*. The buffer layer BF may serve to prevent air or moisture from permeating into element layers constituting the pixel PX. The buffer layer BF may include a plurality of inorganic films that are alternately stacked. For example, the buffer layer BF may be formed as multiple films in which one or more inorganic films of a silicon nitride layer, a silicon oxynitride layer, a silicon oxide layer, a titanium oxide layer, and/or an aluminum oxide layer are alternately stacked. The buffer layer BF may also be omitted according to one or more embodiments.

An active layer ACT may be disposed on the buffer layer BF. The active layer ACT may include a silicon semiconductor such as polycrystalline silicon, single crystal silicon, low-temperature polycrystalline silicon, and/or amorphous silicon, and/or may include an oxide semiconductor.

The active layer ACT may include a channel region, a first region disposed on one side of the channel region, and a second region disposed on the other side of the channel region. The channel region of the active layer ACT may be a region overlapping a gate electrode GE, which will be described later, in the third direction DR3. Each of the first region and the second region of the active layer ACT may be a region that does not overlap the gate electrode GE. The first region and the second region may be conductive regions formed by doping ions into a silicon semiconductor or an oxide semiconductor.

A gate insulating layer 110 may be disposed on the active layer ACT. The gate insulating layer 110 may be formed as an inorganic film, for example, a silicon nitride layer, a silicon oxynitride layer, a silicon oxide layer, a titanium oxide layer, or an aluminum oxide layer.

A first gate metal layer GTL1 may be disposed on the gate insulating layer 110. The first gate metal layer GTL1 may include a gate electrode GE and a first capacitor electrode CAE1 of each sub-pixel. The gate electrode GE may form a thin film transistor for driving the pixel PX together with the active layer ACT. The first gate metal layer GTL1 may be formed as a single layer or multiple layers made of one or more selected from among molybdenum (Mo), aluminum (Al), chromium (Cr), gold (Au), titanium (Ti), nickel (Ni), neodymium (Nd), and/or copper (Cu), and/or an alloy thereof.

A first interlayer insulating layer 130 may be disposed on the first gate metal layer GTL1. The first interlayer insulating layer 130 may be formed as an inorganic film, for example, a silicon nitride layer, a silicon oxynitride layer, a silicon oxide layer, a titanium oxide layer, and/or an aluminum oxide layer.

A second gate metal layer GTL2 may be disposed on the first interlayer insulating layer 130. The second gate metal layer GTL2 may include a second capacitor electrode CAE2. The second capacitor electrode CAE2 may overlap the first capacitor electrode CAE1 in the third direction DR3 to form a capacitor Cst. The second gate metal layer GTL2 may be formed as a single layer or multiple layers made of one or more selected from among molybdenum (Mo), aluminum (Al), chromium (Cr), gold (Au), titanium (Ti), nickel (Ni), neodymium (Nd), and/or copper (Cu), and/or an alloy thereof.

A second interlayer insulating layer 150 may be disposed on the second gate metal layer GTL2. The second interlayer insulating layer 150 may be formed as an inorganic film, for example, a silicon nitride layer, a silicon oxynitride layer, a silicon oxide layer, a titanium oxide layer, and/or an aluminum oxide layer.

A first data metal layer DTL1 including a first connection electrode CE1 and a data line may be disposed on the second interlayer insulating layer 150. The first data metal layer DTL1 may be formed as a single layer or multiple layers made of one or more selected from among molybdenum (Mo), aluminum (Al), chromium (Cr), gold (Au), titanium (Ti), nickel (Ni), neodymium (Nd), and/or copper (Cu), and/or an alloy thereof. In one or more embodiments, the first data metal layer DTL1 may also have a two-layer structure of Ti/Al or a three-layer structure of Ti/Al/Ti.

The first connection electrode CE1 may be connected to the first region or the first region of the active layer ACT through a first contact hole CT1 penetrating through the first interlayer insulating layer 130 and the second interlayer insulating layer 150.

A first via layer 160 for planarizing a step caused by the active layer ACT, the first gate metal layer GTL1, the second gate metal layer GTL2, and the first data metal layer DTL1 may be disposed on the first data metal layer DTL1. The first via layer 160 may be formed as an organic film made of an acryl resin, an epoxy resin, a phenolic resin, a polyamide resin, a polyimide resin, and/or the like.

A second data metal layer DTL2 may be disposed on the first via layer 160. The second data metal layer DTL2 may include a second connection electrode CE2. The second connection electrode CE2 may be connected to the first connection electrode CE1 through a second contact hole CT2 penetrating through the first via layer 160. The second data metal layer DTL2 may be formed as a single layer or multiple layers made of one or more selected from among molybdenum (Mo), aluminum (Al), chromium (Cr), gold (Au), titanium (Ti), nickel (Ni), neodymium (Nd), and/or copper (Cu), and/or an alloy thereof. In one or more embodiments, the second data metal layer DTL2 may also have a two-layer structure of Ti/Al or a three-layer structure of Ti/Al/Ti.

A second via layer 170 may be disposed on the second data metal layer DTL2. The second via layer 170 may be formed as an organic film made of an acryl resin, an epoxy resin, a phenolic resin, a polyamide resin, a polyimide resin, and/or the like.

A third data metal layer DTL3 may be disposed on the second via layer 170. The third data metal layer DTL3 may include a third connection electrode CE3. The third connection electrode CE3 may be connected to the second connection electrode CE2 through a third contact hole CT3 penetrating through the second via layer 170. The third data metal layer DTL3 may be formed as a single layer or multiple layers made of one or more selected from among molybdenum (Mo), aluminum (Al), chromium (Cr), gold (Au), titanium (Ti), nickel (Ni), neodymium (Nd), and/or copper (Cu), and/or an alloy thereof. In one or more embodiments, the third data metal layer DTL3 may also have a two-layer structure of Ti/Al or a three-layer structure of Ti/Al/Ti.

A third via layer 180 may be disposed on the third data metal layer DTL3. The third via layer 180 may be formed as an organic film made of an acryl resin, an epoxy resin, a phenolic resin, a polyamide resin, a polyimide resin, and/or the like.

A fourth data metal layer DTL4 may be disposed on the third via layer 180. The fourth data metal layer DTL4 may include an anode pad electrode APD and a cathode pad electrode CPD. The anode pad electrode APD may be connected to the third connection electrode CE3 through a fourth contact hole CT4 penetrating through the third via layer 180. The cathode pad electrode CPD may be supplied with a first power supply voltage, which is a low potential voltage. The fourth data metal layer DTL4 may be formed as a single layer or multiple layers made of one or more selected from among molybdenum (Mo), aluminum (Al), chromium (Cr), gold (Au), titanium (Ti), nickel (Ni), neodymium (Nd), and/or copper (Cu), and/or an alloy thereof. In one or more embodiments, the fourth data metal layer DTL4 may also have a two-layer structure of Ti/Al or a three-layer structure of Ti/Al/Ti. Hereinafter, for convenience of explanation, it will be mainly described that the fourth data metal layer DTL4 has a three-layer structure of Ti/Al/Ti.

A fifth data metal layer DTL5 may be disposed on each of the anode pad electrode APD and the cathode pad electrode CPD. The fifth data metal layer DTL5 may include a transparent conductive layer TCO to increase adhesion to a first contact electrode CTE1 and a second contact electrode CTE2 of the light emitting element LE. The fifth data metal layer DTL5 may be formed of a transparent conductive oxide such as indium tin oxide (ITO) and/or indium zinc oxide (IZO).

A fourth via layer 190 may be further disposed on the third via layer 180. The fourth via layer 190 may be disposed in a separation space of each of the plurality of sub-pixels. In other words, the fourth via layer 190 may be partially disposed on the third via layer 180 without being entirely disposed thereon. That is, the fourth via layer 190 may serve as a pixel defining film that divides the sub-pixels. The fourth via layer 190 may be formed as an organic film made of an acryl resin, an epoxy resin, a phenolic resin, a polyamide resin, a polyimide resin, and/or the like.

An upper passivation layer PVX may be disposed on the third via layer 180, the fifth data metal layer DTL5, and the fourth via layer 190. The upper passivation layer PVX may cover edges of a transparent conductive layer TCO disposed on the anode pad electrode APD and a transparent conductive layer TCO disposed on the cathode pad electrode CPD, and may cover top and side surfaces of the fourth via layer 190 and a top surface of the third via layer 180 exposed by the fourth via layer 190. The upper passivation layer PVX may be formed as an inorganic film, for example, a silicon nitride layer, a silicon oxynitride layer, a silicon oxide layer, a titanium oxide layer, and/or an aluminum oxide layer.

A first element contact hole CTL1 and a second element contact hole CTL2 exposing portions of the transparent conductive layer TCO disposed on the anode pad electrode APD and the transparent conductive layer TCO disposed on the cathode pad electrode CPD, respectively, may be formed in the upper passivation layer PVX. The first element contact hole CTL1 may expose a portion of the transparent conductive layer TCO disposed on the anode pad electrode APD, and the second element contact hole CTL2 may expose a portion of the transparent conductive layer TCO disposed on the cathode pad electrode CPD.

Each of the plurality of sub-pixels SPX1, SPX2, and SPX3 may include one light emitting element LE. The light emitting elements LE may be disposed on the transparent conductive layer TCO disposed on the anode pad electrode APD and the transparent conductive layer TCO disposed on the cathode pad electrode CPD exposed by the first element contact hole CTL1 and the second element contact hole CTL2, respectively, formed in the upper passivation layer PVX. It is illustrated that the light emitting element LE is a flip chip type micro LED in which the first contact electrode CTE1 and the second contact electrode CTE2 are disposed to face (e.g., oppose) the anode pad electrode APD and the cathode pad electrode CPD.

The light emitting element LE may be an inorganic light emitting element made of an inorganic material such as GaN. The light emitting element LE may have a length in the first direction DR1, a length in the second direction DR2, and a length in the third direction DR3, each of several to hundreds of μm. For example, each of the lengths of the light emitting element LE in the first direction DR1, the second direction DR2, and the third direction DR3 may be approximately 100 μm or less.

The light emitting elements LE may be formed by being grown on a semiconductor substrate such as a silicon wafer. Each of the light emitting elements LE may be directly transferred onto the anode pad electrode APD and the cathode pad electrode CPD of the substrate 100 from the silicon wafer. Alternatively, each of the light emitting elements LE may be transferred onto the anode pad electrode APD and the cathode pad electrode CPD of the substrate 100 through an electrostatic method using an electrostatic head or a stamp method using an elastic polymer material such as PDMS and/or silicon as a transfer substrate.

Each of the light emitting elements LE may be a light emitting structure including a base substrate PSUB, an n-type semiconductor NSEM, an active layer MQW, a p-type semiconductor PSEM, a first contact electrode CTE1, and a second contact electrode CTE2.

The base substrate PSUB of the light emitting element LE may be a sapphire substrate, but is not limited thereto.

The n-type semiconductor NSEM of the light emitting element LE may be disposed on one surface of the base substrate PSUB. For example, the n-type semiconductor NSEM may be disposed on a lower surface of the base substrate PSUB. The n-type semiconductor NSEM may be formed of GaN doped with an n-type conductive dopant such as Si, Ge, and/or Sn.

The active layer MQW of the light emitting element LE may be disposed on a portion of one surface of the n-type semiconductor NSEM. The active layer MQW may include a material having a single or multiple quantum well structure. When the active layer MQW includes the material having the multiple quantum well structure, the active layer MQW may also have a structure in which a plurality of well layers and barrier layers are alternately stacked. In this case, the well layer may be formed of InGaN, and the barrier layer may be formed of GaN and/or AlGaN, but the present disclosure is not limited thereto.

Alternatively, the active layer MQW may also have a structure in which semiconductor materials having large band gap energy and semiconductor materials having small band gap energy are alternately stacked, and may also include Group III to Group V semiconductor materials depending on a wavelength band of emitted light.

The p-type semiconductor PSEM may be disposed on one surface of the active layer MQW. The p-type semiconductor PSEM may be formed of GaN doped with a p-type conductive dopant such as Mg, Zn, Ca, Se, and/or Ba.

The first contact electrode CTE1 may be disposed on the p-type semiconductor PSEM, and the second contact electrode CTE2 may be disposed on another portion of one surface of the n-type semiconductor NSEM. Another portion of one surface of the n-type semiconductor NSEM on which the second contact electrode CTE2 is disposed may be disposed to be spaced from a portion of one surface of the n-type semiconductor NSEM on which the active layer MQW is disposed.

The first contact electrode CTE1 and the anode pad electrode APD may be bonded to each other through a conductive adhesive member such as an anisotropic conductive film (ACF) or an anisotropic conductive paste (ACP). Alternatively, the first contact electrode CTE1 and the anode pad electrode APD may be bonded to each other through a soldering process.

Hereinafter, an arrangement relationship between the pixels PX and the side wirings 200 and an arrangement relationship between the side wirings 200 and the driving unit will be described.

Figure 6:
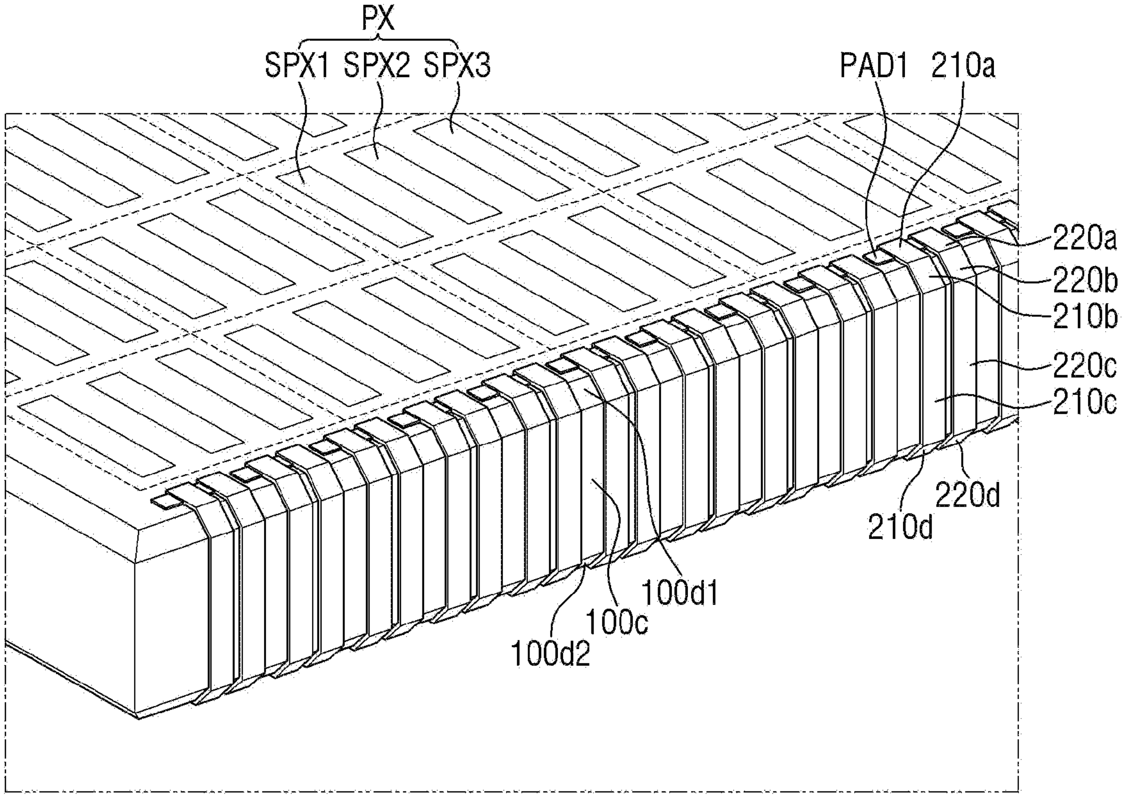
FIG. 6 is a perspective view illustrating an arrangement relationship between pixels and side wirings of a display device according to one or more embodiments.
Figure 6:
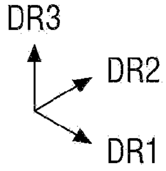
Figure 7:
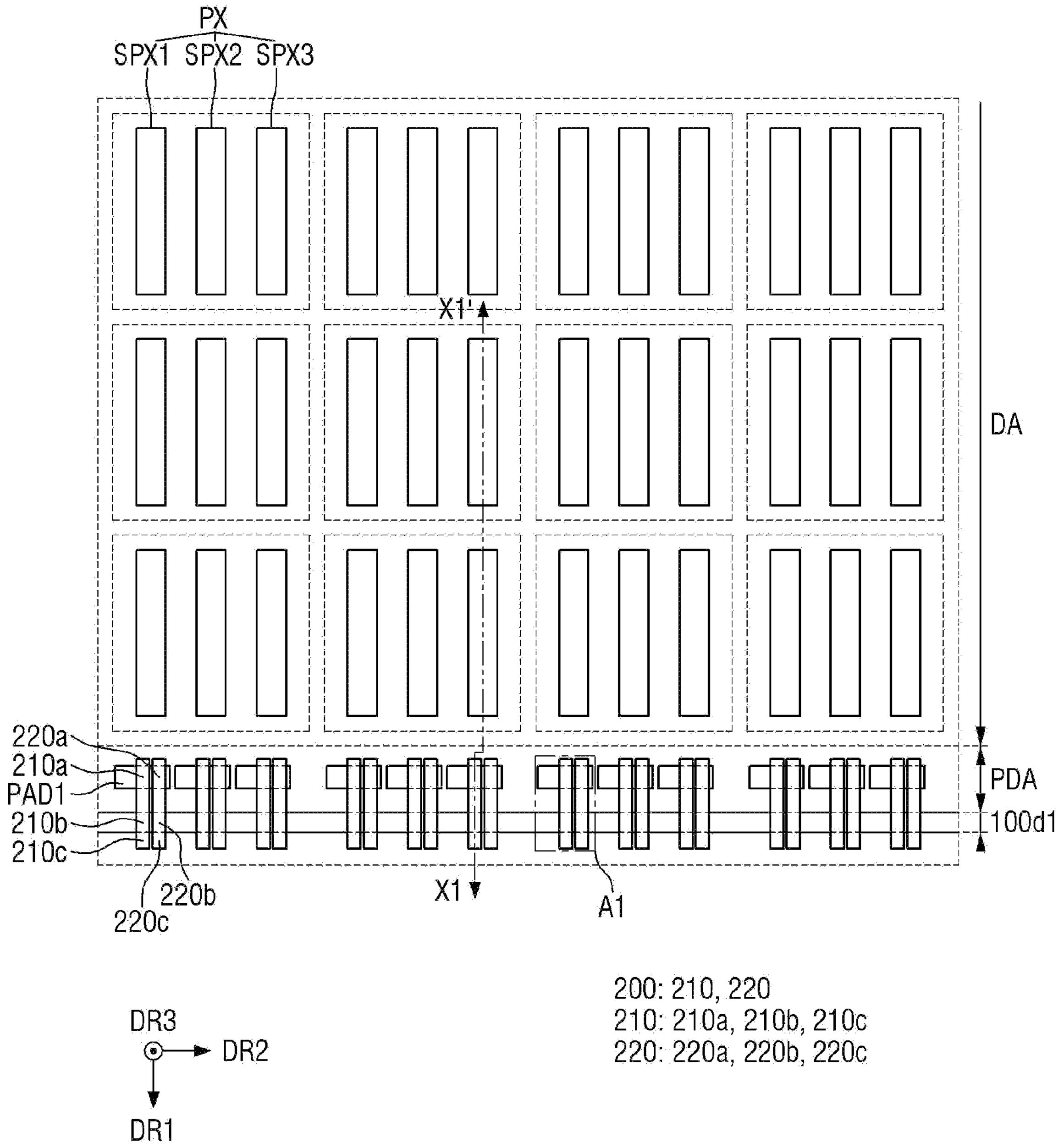
FIG. 7 is a plan view illustrating an arrangement relationship between pixels and side wirings of a display device according to one or more embodiments.
Figure 8:
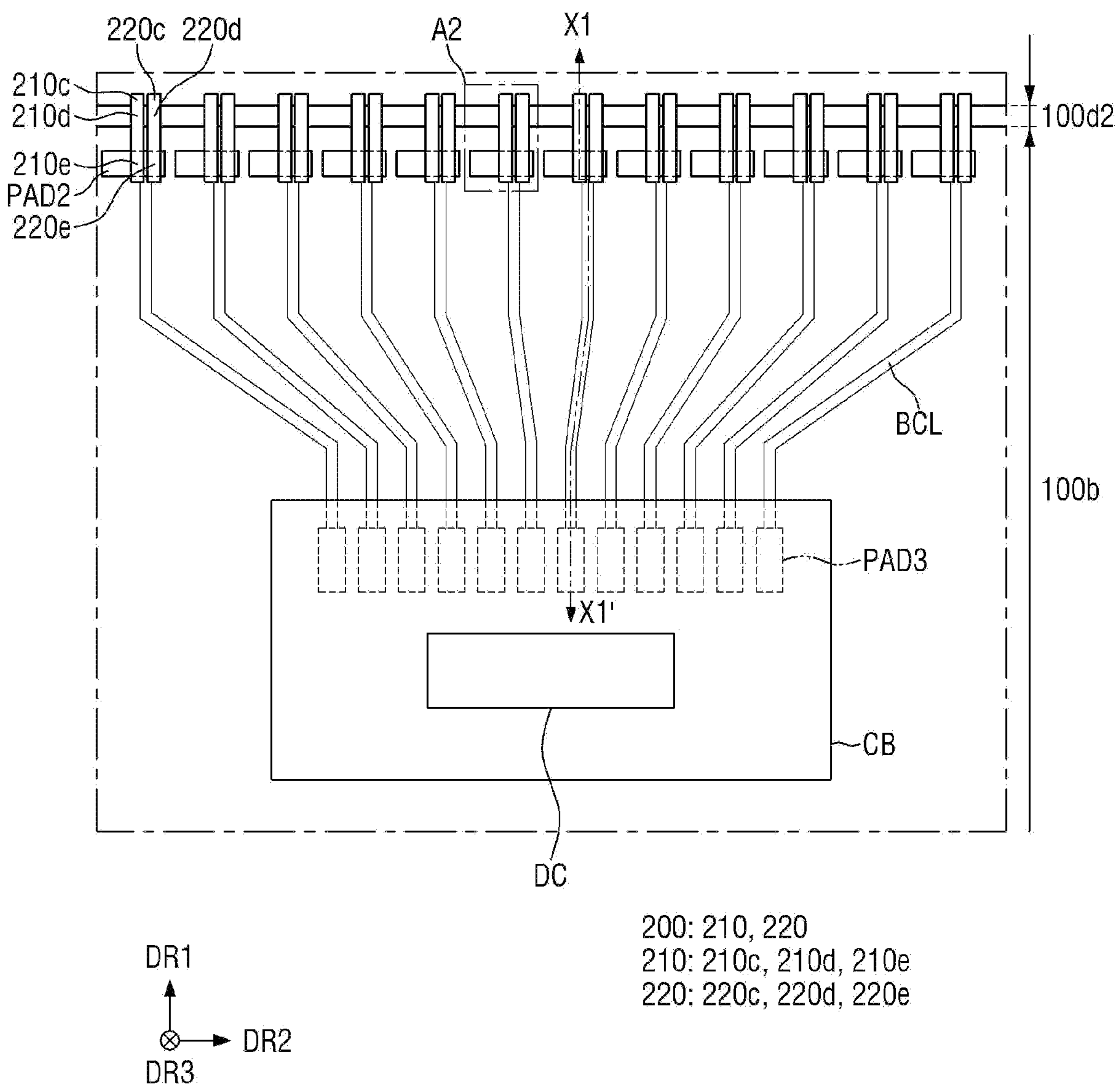
FIG. 8 is a rear view illustrating an arrangement relationship between a driving unit and side wirings of a display device according to one or more embodiments.

FIG. 6 is a perspective view illustrating an arrangement relationship between pixels and side wirings of a display device according to one or more embodiments. FIG. 7 is a plan view illustrating an arrangement relationship between pixels and side wirings of a display device according to one or more embodiments. FIG. 8 is a rear view illustrating an arrangement relationship between a driving unit and side wirings of a display device according to one or more embodiments.

Referring to FIGS. 6 to 8, the display device 10 further includes a plurality of first pads PAD1, a plurality of second pads PAD2, a plurality of third pads PAD3, and a plurality of bottom connection lines BCL, and the side wiring 200 includes a first side wiring 210 and a second side wiring 220 spaced from each other in the second direction DR2.

Referring to FIG. 7 together with FIG. 6, the plurality of first pads PAD1 may serve to transmit the electric signal of the driving unit to each of the plurality of pixels PX. The first pads PAD1 may be disposed on the first surface 100*a* of the substrate 100. The first pads PAD1 may be disposed on one side edge of the first surface 100*a* of the substrate 100 in the first direction DR1, that is, on a pad area PDA. The pad area PDA, which is a portion of the non-display area NDA, may refer to a non-display area NDA disposed at one side edge of the display area DA in the first direction DR1. The first pads PAD1 may be arranged along the second direction DR2.

Each of the plurality of first pads PAD1 may have a shape extending in the second direction DR2. The side wiring 200 may expose a portion of each of the plurality of first pads PAD1. In other words, widths of the first side wiring 210 and the second side wiring 220 in the second direction DR2 may be smaller than a width of each of the plurality of first pads PAD1 in the second direction DR2. In one or more embodiments, a portion of the first pad PAD1 may protrude from the side wiring 200 to the other side thereof in the second direction DR2 and may be exposed, but is not limited thereto. For example, a portion of the first pad PAD1 may also protrude from the side wiring 200 to one side thereof in the second direction DR2 and may be exposed.

A portion of the first pad PAD1 protruding in the second direction DR2 from the side wiring 200, which is a portion that does not overlap the side wiring 200 in the third direction DR3, may be an area where a first inspection opening IOP1 (see FIG. 10) capable of inspecting contact between a plurality of pad electrodes constituting the first pad PAD1 is formed as will be described later. This will be described in detail below. In one or more embodiments, the area in which the first inspection opening IOP1 of the first pad PAD1 is formed may be referred to as a first inspection portion.

A portion of the first pad PAD1 overlapping the side wiring 200 may be an area where the plurality of pad electrodes constituting the first pad PAD1 and the side wiring 200 are in contact with each other. For example, a portion of the first pad PAD1 overlapping the first side wiring 210 may be referred to as a first contact portion, and a portion of the first pad PAD1 overlapping the second side wiring 220 may be referred to as a second contact portion.

Figure 9:
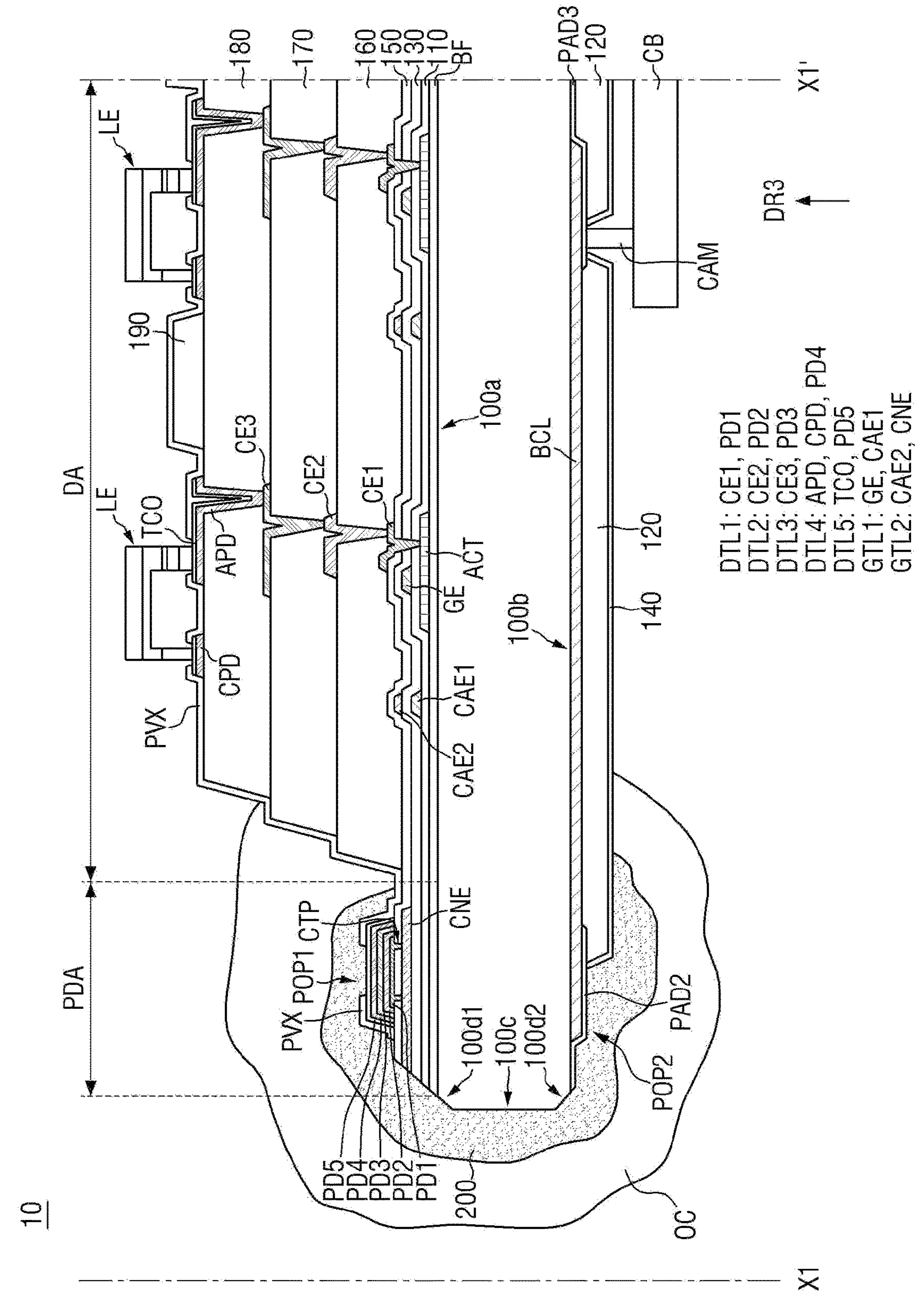
FIG. 9 is a cross-sectional view schematically illustrating a cross section taken along the line X1-X1' of FIGS. 7 and 8.

The first pad PAD1 may be connected to the plurality of pixels PX by a top connection line CNE (see FIG. 9). Although a specific connection relationship between the top connection line CNE and the plurality of pixels PX is not discussed in detail, the top connection line CNE may be formed of the same layer as the above-described second gate metal layer GTL2 and may be electrically connected to a transistor layer that transmits an electric signal to the light emitting element LE.

Referring to FIG. 8 together with FIG. 6, the plurality of second pads PAD2 may serve to transmit the electric signal of the driving unit to the first pads PAD1 through the side wiring 200. The second pads PAD2 may be disposed on the second surface 100*b* of the substrate 100. The second pads PAD2 may be disposed at one side edge of the second surface 100*b* of the substrate 100 in the first direction DR1. The second pads PAD2 may be arranged along the second direction DR2. The second pads PAD2 may be connected to the driving unit through a bottom connection line BCL.

Each of the plurality of second pads PAD2 may have a shape extending in the second direction DR2. The side wiring 200 may expose a portion of each of the plurality of second pads PAD2. In other words, widths of the first side wiring 210 and the second side wiring 220 in the second direction DR2 may be smaller than a width of each of the plurality of second pads PAD2 in the second direction DR2. In one or more embodiments, a portion of the second pad PAD2 may protrude from the side wiring 200 to the other side thereof in the second direction DR2 and may be exposed, but is not limited thereto. For example, a portion of the second pad PAD2 may also protrude from the side wiring 200 to one side thereof in the second direction DR2 and may be exposed.

A portion of the second pad PAD2 protruding in the second direction DR2 from the side wiring 200, which is a portion that does not overlap the side wiring 200 in the third direction DR3, may be an area where a second inspection opening IOP2 (see FIG. 11) capable of inspecting contact between a plurality of pad electrodes constituting the second pad PAD2 is formed as will be described later. This will be described in detail below. In one or more embodiments, the area in which the second inspection opening IOP2 of the second pad PAD2 is formed may be referred to as a second inspection portion.

A portion of the second pad PAD2 overlapping the side wiring 200 may be an area where the plurality of pad electrodes constituting the second pad PAD2 and the side wiring 200 are in contact with each other. For example, a portion of the second pad PAD2 overlapping the first side wiring 210 may be referred to as a third contact portion, and a portion of the second pad PAD2 overlapping the second side wiring 220 may be referred to as a fourth contact portion.

The second pad PAD2 may be connected to the third pad PAD3 and the driving unit disposed thereon by the bottom connection line BCL. The plurality of third pads PAD3 may serve to transmit the electrical signal generated from the driving unit to the second pads PAD2 through the bottom connection line BCL.

The third pads PAD3 may be disposed on the second surface 100*b* of the substrate 100. The third pads PAD3 may be disposed closer to a center of the second surface 100*b* of the substrate 100 than the second pads PAD2. The third pads PAD3 may be arranged along the second direction DR2. The third pads PAD3 may be arranged to correspond to terminals formed on the driving unit. In other words, the third pads PAD3 may be arranged to correspond to the terminals formed on the circuit board CB of the driving unit. In order to connect more third pads PAD3 to the circuit board CB, an interval between the third pads PAD3 adjacent to each other in the second direction DR2 may be smaller than an interval between the second pads PAD2 adjacent to each other in the second direction DR2. For example, a distance in the second direction DR2 between first ends of the adjacent second pads PAD2 may be greater than a distance in the second direction DR2 between first ends of the adjacent third pads PAD3.

Because the interval between the second pads PAD2 adjacent to each other in the second direction DR2 and the interval between the third pads PAD3 adjacent to each other in the second direction DR2 are different, the bottom connection line BCL may be bent at least once. The bottom connection line BCL may be integrally formed with the second pad PAD2 and the third pad PAD3. The second pad PAD2, the third pad PAD3, and the bottom connection line BCL may be formed as a single layer or multiple layers made of one or more selected from among molybdenum (Mo), aluminum (Al), chromium (Cr), gold (Au), titanium (Ti), nickel (Ni), neodymium (Nd), and/or copper (Cu), and/or an alloy thereof.

Referring back to FIGS. 6 to 8, each of the side wirings 200 may include a first flat portion, a first inclined portion, a connection portion, a second inclined portion, and a second flat portion. For example, the first side wiring 210 may include a first flat portion 210*a*, a first inclined portion 210*b*, a connection portion 210*c*, a second inclined portion 210*d*, and a second flat portion 210*e*, and the second side wiring 220 may include a first flat portion 220*a*, a first inclined portion 220*b*, a connection portion 220*c*, a second inclined portion 220*d*, and a second flat portion 220*e*.

The first flat portion 210*a* of the first side wiring 210 and the first flat portion 220*a* of the second side wiring 220 may be portions disposed on the first surface 100*a* of the substrate 100, specifically, the pad area PDA of the first surface 100*a*.

The first flat portion 210*a* of the first side wiring 210 and the first flat portion 220*a* of the second side wiring 220 may be disposed on the first pad PAD1, and may be disposed to partially cover the first pad PAD1 and may be electrically connected to the first pad PAD1. The first flat portion 210*a* of the first side wiring 210 and the first flat portion 220*a* of the second side wiring 220 may be spaced from each other in the second direction DR2.

The first inclined portion 210*b* of the first side wiring 210 and the first inclined portion 220*b* of the second side wiring 220 may be portions disposed on the first chamfered surface 100*d*1 of the substrate 100. The first inclined portion 210*b* of the first side wiring 210 and the first inclined portion 220*b* of the second side wiring 220 may form an inclination along a direction in which the first chamfered surface 100*d*1 is inclined.

The first inclined portion 210*b* of the first side wiring 210 may be disposed between the first flat portion 210*a* and the connection portion 210*c* of the first side wiring 210, and the first inclined portion 220*b* of the second side wiring 220 may be disposed between the first flat portion 220*a* and the connection portion 220*c* of the second side wiring 220. The first inclined portion 210*b* of the first side wiring 210 and the first inclined portion 220*b* of the second side wiring 220 may be spaced from each other in the second direction DR2.

The connection portion 210*c* of the first side wiring 210 and the connection portion 220*c* of the second side wiring 220 may be portions disposed on the first side surface 100*c* of the substrate 100.

The connection portion 210*c* of the first side wiring 210 may be disposed between the first inclined portion 210*b* and the second inclined portion 210*d* of the first side wiring 210, and the connection portion 220*c* of the second side wiring 220 may be disposed between the first inclined portion 220*b* and the second inclined portion 220*d* of the second side wiring 220. The connection portion 210*c* of the first side wiring 210 and the connection portion 220*c* of the second side wiring 220 may be spaced from each other in the second direction DR2.

The second inclined portion 210*d* of the first side wiring 210 and the second inclined portion 220*d* of the second side wiring 220 may be portions disposed on the second chamfered surface 100*d*2 of the substrate 100. The second inclined portion 210*d* of the first side wiring 210 and the second inclined portion 220*d* of the second side wiring 220 may form an inclination along a direction in which the second chamfered surface 100*d*2 is inclined.

The second inclined portion 210*d* of the first side wiring 210 may be disposed between the second flat portion 210*e* and the connection portion 210*c* of the first side wiring 210, and the second inclined portion 220*d* of the second side wiring 220 may be disposed between the second flat portion 220*e* and the connection portion 220*c* of the second side wiring 220. The second inclined portion 210*d* of the first side wiring 210 and the second inclined portion 220*d* of the second side wiring 220 may be spaced from each other in the second direction DR2.

The second flat portion 210*e* of the first side wiring 210 and the second flat portion 220*e* of the second side wiring 220 may be portions disposed on the second surface 100*b* of the substrate 100. The second flat portion 210*e* of the first side wiring 210 and the second flat portion 220*e* of the second side wiring 220 may be disposed on the second pad PAD2 to cover a portion of the second pad PAD2.

The second flat portion 210*e* of the first side wiring 210 and the second flat portion 220*e* of the second side wiring 220 may be electrically connected to the second pad PAD2. The second flat portion 210*e* of the first side wiring 210 and the second flat portion 220*e* of the second side wiring 220 may be spaced from each other in the second direction DR2.

The side wiring 200 may include metal powder including metal particles such as silver (Ag) and/or copper (Cu) and a polymer such as an acrylic resin and/or an epoxy resin. The metal powder enables the side wiring 200 to have conductivity, and the polymer may serve as a binder connecting the metal particles. Hereinafter, for convenience of explanation, it will be mainly described that the side wiring 200 includes silver (Ag).

The side wiring 200 may be formed by printing a metal paste containing metal particles, a monomer, and a solution on the substrate 100 using a silicon pad and then sintering the metal paste using a laser. In the side wiring 200, the metal particles may come into close contact with each other and aggregate while the monomer is reacted as a polymer by heat from the laser in the sintering process, so that specific resistance may be lowered.

As described above, as the plurality of side wirings 200 are in contact with the first pad PAD1 and the second pad PAD2, one side wiring 200 may serve as a spare for the other side wiring 200. Accordingly, device reliability of the display device 10 may be improved.

For example, the first side wiring 210 and the second side wiring 220 connected to the first pad PAD1 and the second pad PAD2 may be redundancy lines of each other. Even if the first pad PAD1 and the second pad PAD2 are not connected through the first side wiring 210 due to contact failure between the first side wiring 210 and the first pad PAD1 caused by foreign matter permeating into a contact interface between the first side wiring 210 and the first pad PAD1, the connection between the first pad PAD1 and the second pad PAD2 is secured by the contact between the second side wiring 220 and the first pad PAD1. As a result, reliability of the display device 10 may be improved.

Hereinafter, a stacked structure of each of the above-described components will be described.

Figure 10:
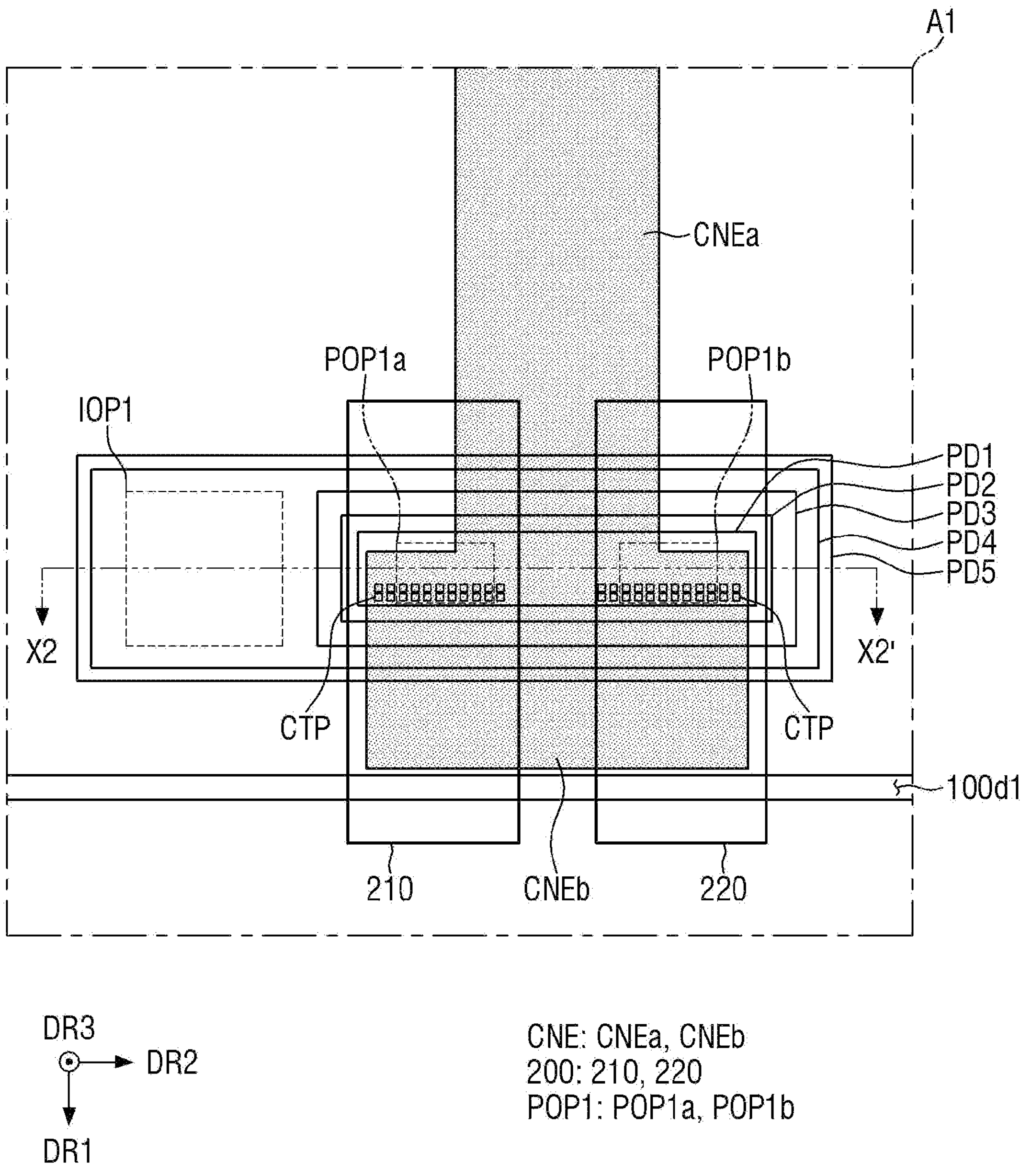
FIG. 10 is an enlarged view of an area A1 of FIG. 7.
Figure 11:
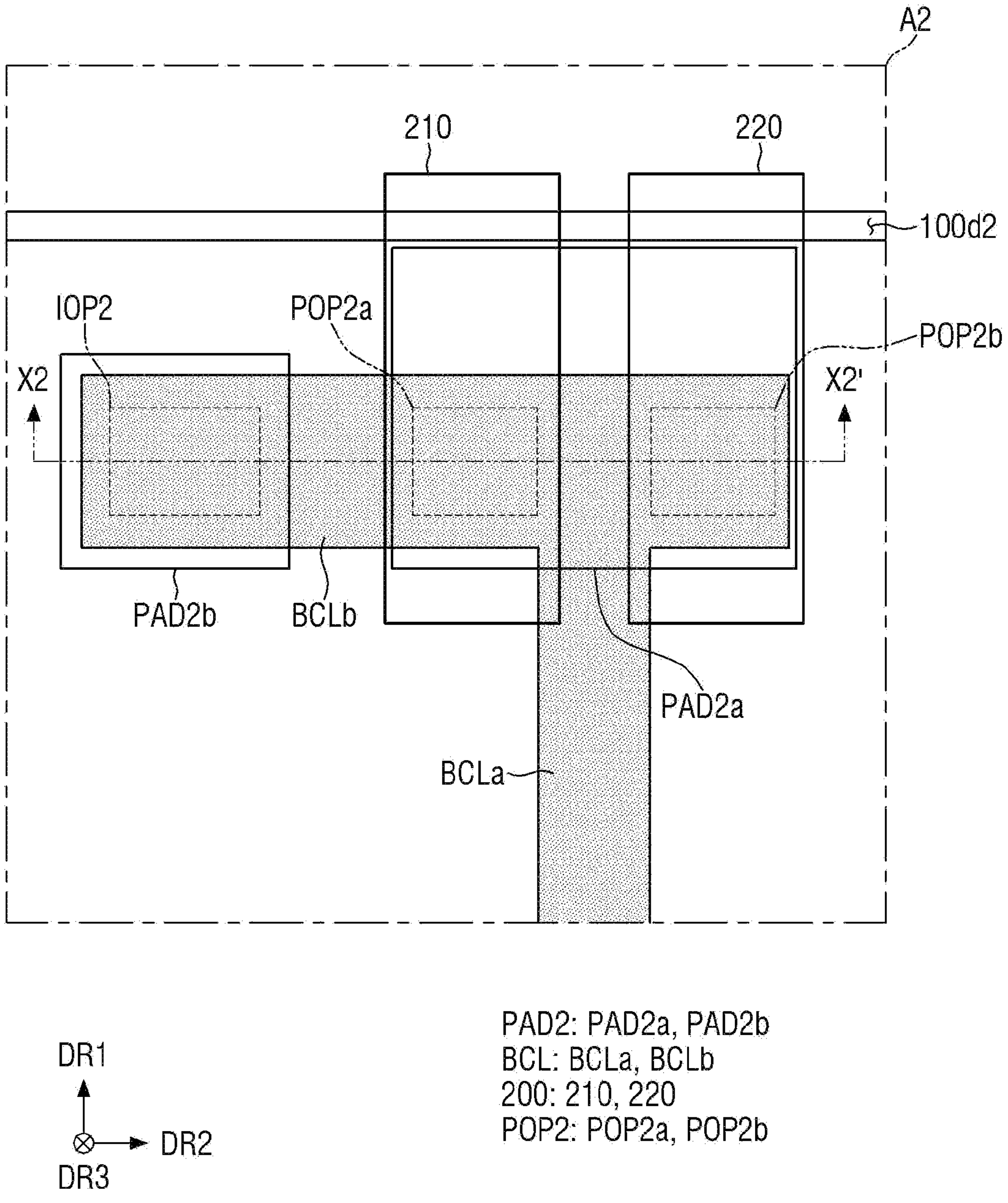
FIG. 11 is an enlarged view of an area A2 of FIG. 8.
Figure 12:
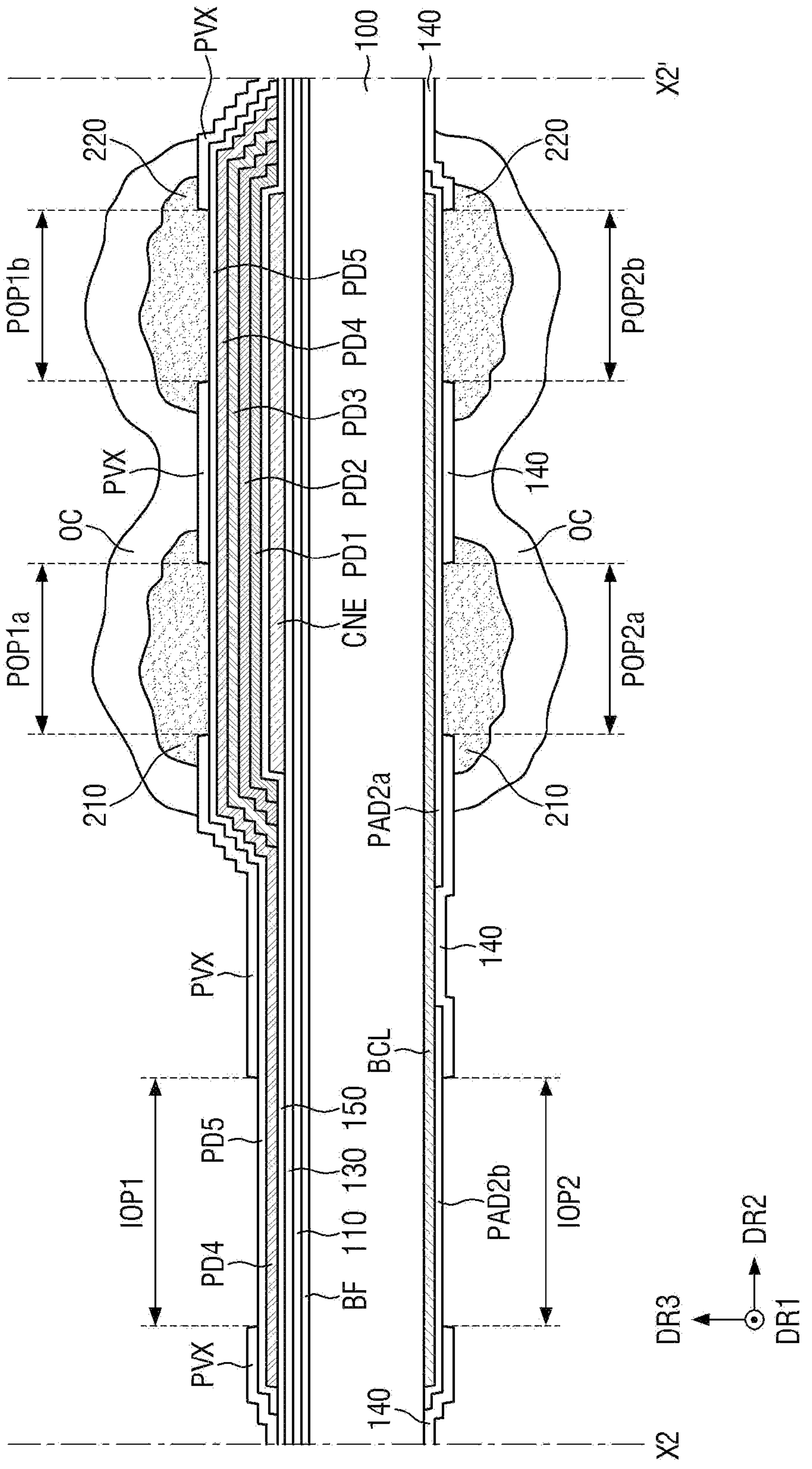
FIG. 12 is a cross-sectional view schematically illustrating a cross section taken along the line X2-X2' of FIGS. 10 and 11.

FIG. 9 is a cross-sectional view schematically illustrating a cross section taken along the line X1-X1' of FIGS. 7 and 8. FIG. 10 is an enlarged view of an area A1 of FIG. 7. FIG. 11 is an enlarged view of an area A2 of FIG. 8. FIG. 12 is a cross-sectional view schematically illustrating a cross section taken along the line X2-X2' of FIGS. 10 and 11.

Referring to FIGS. 9 to 12, the first pad PAD1 may be disposed adjacent to the outermost pixel PX but may be spaced from each other, and the second pad PAD2 may be disposed on the second surface 100*b* of the substrate 100.

A structure of the first pad PAD1 will be described with reference to FIGS. 9, 10, and 12. The first pad PAD1 may include a first upper pad electrode PD1, a second upper pad electrode PD2, a third upper pad electrode PD3, a fourth upper pad electrode PD4, and a fifth upper pad electrode PD5.

In the pad area PDA, the first data metal layer DTL1 may further include the first upper pad electrode PD1, the second data metal layer DTL2 may further include the second upper pad electrode PD2, the third data metal layer DTL3 may further include the third upper pad electrode PD3, the fourth data metal layer DTL4 may further include the fourth upper pad electrode PD4, and the fifth data metal layer DTL5 may further include the fifth upper pad electrode PD5. In other words, the second upper pad electrode PD2 may be disposed on the first upper pad electrode PD1, the third upper pad electrode PD3 may be disposed on the second upper pad electrode PD2, the fourth upper pad electrode PD4 may be disposed on the third upper pad electrode PD3, and the fifth upper pad electrode PD5 may be disposed on the fourth upper pad electrode PD4.

A top surface of the first upper pad electrode PD1 may be in direct contact with a bottom surface of the second upper pad electrode PD2, a top surface of the second upper pad electrode PD2 may be in direct contact with a bottom surface of the third upper pad electrode PD3, a top surface of the third upper pad electrode PD3 may be in direct contact with a bottom surface of the fourth upper pad electrode PD4, and a top surface of the fourth upper pad electrode PD4 may be in direct contact with a bottom surface of the fifth upper pad electrode PD5.

The second upper pad electrode PD2 may be disposed on the first upper pad electrode PD1 to entirely cover the top and side surfaces of the first upper pad electrode PD1, the third upper pad electrode PD3 may be disposed on the second upper pad electrode PD2 to entirely cover the top and side surfaces of the second upper pad electrode PD2, the fourth upper pad electrode PD4 may be disposed on the third upper pad electrode PD3 to entirely cover the top and side surfaces of the third upper pad electrode PD3, and the fifth upper pad electrode PD5 may be disposed on the fourth upper pad electrode PD4 to entirely cover the top and side surfaces of the fourth upper pad electrode PD4.

In other words, as illustrated in FIG. 10, a planar area of the fifth upper pad electrode PD5 may be greater than a planar area of the fourth upper pad electrode PD4, the planar area of the fourth upper pad electrode PD4 may be greater than a planar area of the third upper pad electrode PD3, the planar area of the third upper pad electrode PD3 may be greater than a planar area of the second upper pad electrode PD2, and the planar area of the second upper pad electrode PD2 may be greater than a planar area of the first upper pad electrode PD1.

The first upper pad electrode PD1 of the first pad PAD1 may be disposed on the second interlayer insulating layer 150. The first upper pad electrode PD1 may be electrically connected to the top connection line CNE disposed on the first interlayer insulating layer 130 through a pad contact hole CTP penetrating through the second interlayer insulating layer 150.

The top connection line CNE may include a line portion CNEa extending in the first direction DR1 and a contact portion CNEb disposed on one side of the line portion CNEa and having a wider width in the second direction DR2 than that of the line portion CNEa. The line portion CNEa of the top connection line CNE may be electrically connected to the above-described data line. The contact portion CNEb may be in contact with the first pad PAD1 through the pad contact hole CTP by overlapping the pad contact hole CTP.

The upper passivation layer PVX may be disposed on the first pad PAD1 to form an upper pad opening POP1 exposing the first pad PAD1, and the first pad PAD1 may be in contact with the side wiring 200 through the upper pad opening POP1. Accordingly, the first pad PAD1 may be electrically connected to the side wiring 200.

The upper pad opening POP1 of the upper passivation layer PVX may be formed on a portion of the first pad PAD1 overlapping the side wiring 200. For example, the upper pad opening POP1 may include a first upper pad opening POP1*a* overlapping the first side wiring 210 and a second upper pad opening POP1*b* overlapping the second side wiring 220. The first upper pad opening POP1*a* and the second upper pad opening POP1*b* may be spaced from each other in the second direction DR2.

The first upper pad electrode PD1, the second upper pad electrode PD2, the third upper pad electrode PD3, the fourth upper pad electrode PD4, and the fifth upper pad electrode PD5 may be disposed to overlap the first side wiring 210 and the second side wiring 220 in the third direction DR3. In other words, the first upper pad opening POP1*a* and the second upper pad opening POP1*b* may overlap the first upper pad electrode PD1, the second upper pad electrode PD2, the third upper pad electrode PD3, the fourth upper pad electrode PD4, and the fifth upper pad electrode PD5.

The upper passivation layer PVX may further include a first inspection opening IOP1 disposed on the first pad PAD1 to expose the first pad PAD1. The first inspection opening IOP1 may provide a space for inspecting a contact between various pad electrodes constituting the first pad PAD1 and inspecting whether the connection between the first pad PAD1 and the pixel PX is properly made. For example, an inspection device is connected to a portion of the first pad PAD1 exposed by the first inspection opening IOP1, so that the contact between various pad electrodes constituting the first pad PAD1 and connectivity between the first pad PAD1 and the pixel PX may be inspected.

In one or more embodiments, the first upper pad electrode PD1, the second upper pad electrode PD2, and the third upper pad electrode PD3 are disposed so as not to overlap the first inspection opening IOP1, and the fourth upper pad electrode PD4 and the fifth upper pad electrode PD5 may extend in the second direction DR2 from portions overlapping the first upper pad opening POP1*a* and the second upper pad opening POP1*b* and overlap the first inspection opening IOP1, but the present disclosure is not limited thereto. For example, the first upper pad electrode PD1, the second upper pad electrode PD2, and the third upper pad electrode PD3 may also be disposed to extend in the second direction DR2 from portions overlapping the first upper pad opening POP1*a* and the second upper pad opening POP1*b* and overlap the first inspection opening IOP1. It is illustrated in FIG. 10 that the first upper pad electrode PD1, the second upper pad electrode PD2, and the third upper pad electrode PD3 are disposed so as not to overlap the first inspection opening IOP1, and the fourth upper pad electrode PD4 and the fifth upper pad electrode PD5 extend in the second direction DR2 from the portions overlapping the first upper pad opening POP1*a* and the second upper pad opening POP1*b* and overlap the first inspection opening IOP1.

A connection relationship between the second pad PAD2 and the driving unit will be described with reference to FIGS. 9, 11, and 12. The second pad PAD2 may be electrically connected to the third pad PAD3 through the bottom connection line BCL, and the circuit board CB may be disposed on the third pad PAD3.

The bottom connection line BCL may be disposed to extend in the first direction DR1 on the second surface 100*b* of the substrate 100. The bottom connection line BCL may be formed as a single layer or multiple layers made of one or more selected from among molybdenum (Mo), aluminum (Al), chromium (Cr), gold (Au), titanium (Ti), nickel (Ni), neodymium (Nd), and/or copper (Cu), and/or an alloy thereof.

The bottom connection line BCL may include a line portion BCLa extending in the first direction DR1 and a contact portion BCLb disposed on one side of the line portion BCLa and having a wider width in the second direction DR2 than that of the line portion BCLa. The contact portion BCLb may be in contact with the second pad PAD2, and the line portion BCLa may connect the contact portion BCLb and the third pad PAD3.

The third pad PAD3 may be disposed on the bottom connection line BCL. The third pad PAD3 may be formed of a transparent conductive oxide such as indium tin oxide (ITO) and/or indium zinc oxide (IZO).

A lower via layer 120 may be disposed on the second surface 100*b* of the substrate 100. Specifically, the lower via layer 120 may be disposed on the other side surface of the bottom connection line BCL in the third direction DR3. The lower via layer 120 may partially cover the second and third pads PAD2 and PAD3, but may expose at least portions of the second pad PAD2 and the third pad PAD3. A portion of the second pad PAD2 exposed by the lower via layer 120 may be in direct contact with and may be electrically connected to the side wiring 200, and a portion of the third pad PAD3 exposed by the lower via layer 120 may be electrically connected to the circuit board CB by a conductive adhesive member CAM. The conductive adhesive member CAM may be an anisotropic conductive film or an anisotropic conductive paste.

The lower via layer 120 may be formed as an organic film made of an acryl resin, an epoxy resin, a phenolic resin, a polyamide resin, a polyimide resin, and/or the like.

A lower passivation layer 140 may cover the lower via layer 120. The lower passivation layer 140 may be disposed on the second pad PAD2 and the third pad PAD3 to form an opening exposing the second pad PAD2 and the third pad PAD3. In other words, each of the second pad PAD2 and the third pad PAD3 may include a portion exposed by the lower passivation layer 140.

The lower passivation layer 140 may be formed as an inorganic film, for example, a silicon nitride layer, a silicon oxynitride layer, a silicon oxide layer, a titanium oxide layer, and/or an aluminum oxide layer.

As illustrated in FIG. 11, the lower passivation layer 140 may have a lower pad opening POP2 formed at a portion of the second pad PAD2 overlapping the side wiring 200 and a second inspection opening IOP2 formed at a portion of the second pad PAD2 that does not overlap the side wiring 200. For example, the lower pad opening POP2 may include a first lower pad opening POP2*a* overlapping the first side wiring 210 and a second lower pad opening POP2*b* overlapping the second side wiring 220.

The second pad PAD2 may include a first portion PAD2*a* overlapping the side wiring 200 and a second portion PAD2*b* that does not overlap the side wiring 200. The first portion PAD2*a* and the second portion PAD2*b* may be disposed on the contact portion BCLb of the bottom connection line BCL.

In one or more embodiments, the first portion PAD2*a* and the second portion PAD2*b* may be spaced from each other in the second direction DR2, but are not limited thereto. For example, the first portion PAD2*a* and the second portion PAD2*b* may be integrally formed. It is illustrated in FIG. 11 that the first portion PAD2*a* and the second portion PAD2*b* are spaced from each other in the second direction DR2.

The first lower pad opening POP2*a* and the second lower pad opening POP2*b* of the lower passivation layer 140 may be formed on the first portion PAD2*a* of the second pad PAD2, and the second inspection opening IOP2 thereof may be formed on the second portion PAD2*b*.

Accordingly, the first side wiring 210 may be in contact with the second pad PAD2 through the first lower pad opening POP2*a*, and the second side wiring 220 may be in contact with the second pad PAD2 through the second lower pad opening POP2*b*.

The second inspection opening IOP2 may provide a space for inspecting a contact between various electrodes constituting the second pad PAD2 and inspecting whether the connection between the second pad PAD2 and the driving unit is properly made. For example, an inspection device is connected to a portion of the second pad PAD2 exposed by the second inspection opening IOP2, so that the contact between the second pad PAD2 and the contact portion BCLb of the bottom connection line BCL on a lower side thereof and connectivity between the second pad PAD2 and the circuit board CB may be inspected.

Referring to FIGS. 9 and 12, the side wiring 200 may be disposed on the first surface 100*a*, the first chamfered surface 100*d*1, the first side surface 100*c*, the second chamfered surface 100*d*2, and the second surface 100*b* of the substrate 100.

The side wiring 200 may be electrically connected to the first pad PAD1 disposed on the first surface 100*a* of the substrate 100. The side wiring 200 may be connected to the second pad PAD2 disposed on the second surface 100*b* of the substrate 100. The side wiring 200 may be in contact with the first chamfered surface 100*d*1, the first side surface 100*c*, and the second chamfered surface 100*d*2 of the substrate 100.

An overcoat layer OC may be disposed on the first surface 100*a*, the first chamfered surface 100*d*1, the first side surface 100*c*, the second chamfered surface 100*d*2, and the second surface 100*b* of the substrate 100. The overcoat layer OC may be disposed to cover the side wiring 200.

For example, the overcoat layer OC may cover the first side wiring 210 and the second side wiring 220, respectively. Accordingly, the overcoat layer OC may be in direct contact with the upper passivation layer PVX in the separation space between the first side wiring 210 and the second side wiring 220 disposed on the first surface 100*a* of the substrate 100, and may be in direct contact with the lower passivation layer 140 in the separation space between the first side wiring 210 and the second side wiring 220 disposed on the second surface 100*b* of the substrate 100.

The overcoat layer OC may be formed as an organic film made of an acryl resin, an epoxy resin, a phenolic resin, a polyamide resin, a polyimide resin, and/or the like.

Because the first side wiring 210 and the second side wiring 220 are independently connected to the first pad PAD1 and the second pad PAD2 by the configuration described above, the first side wiring 210 and the second side wiring 220 may be redundancy lines of each other. Accordingly, even if the first pad PAD1 and the second pad PAD2 are not connected through the first side wiring 210 due to contact failure between the first side wiring 210 and the first pad PAD1 caused by foreign matter permeating into a contact interface between the first side wiring 210 and the first pad PAD1, the connection between the first pad PAD1 and the second pad PAD2 is secured by the contact between the second side wiring 220 and the first pad PAD1. As a result, reliability of the display device may be improved.

Hereinafter, a structure of a tiled display including the display device 10 according to one or more embodiments will be described.

Figure 13:
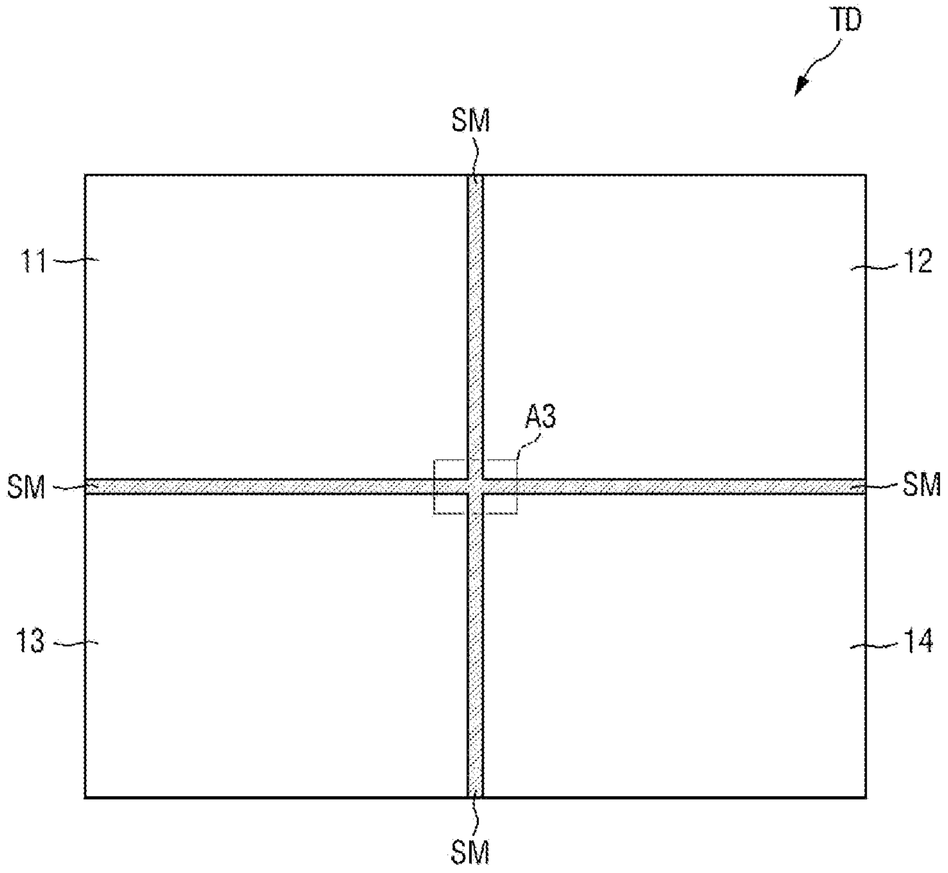
FIG. 13 is a plan view schematically illustrating a tiled display using a display device according to one or more embodiments.
Figure 14:
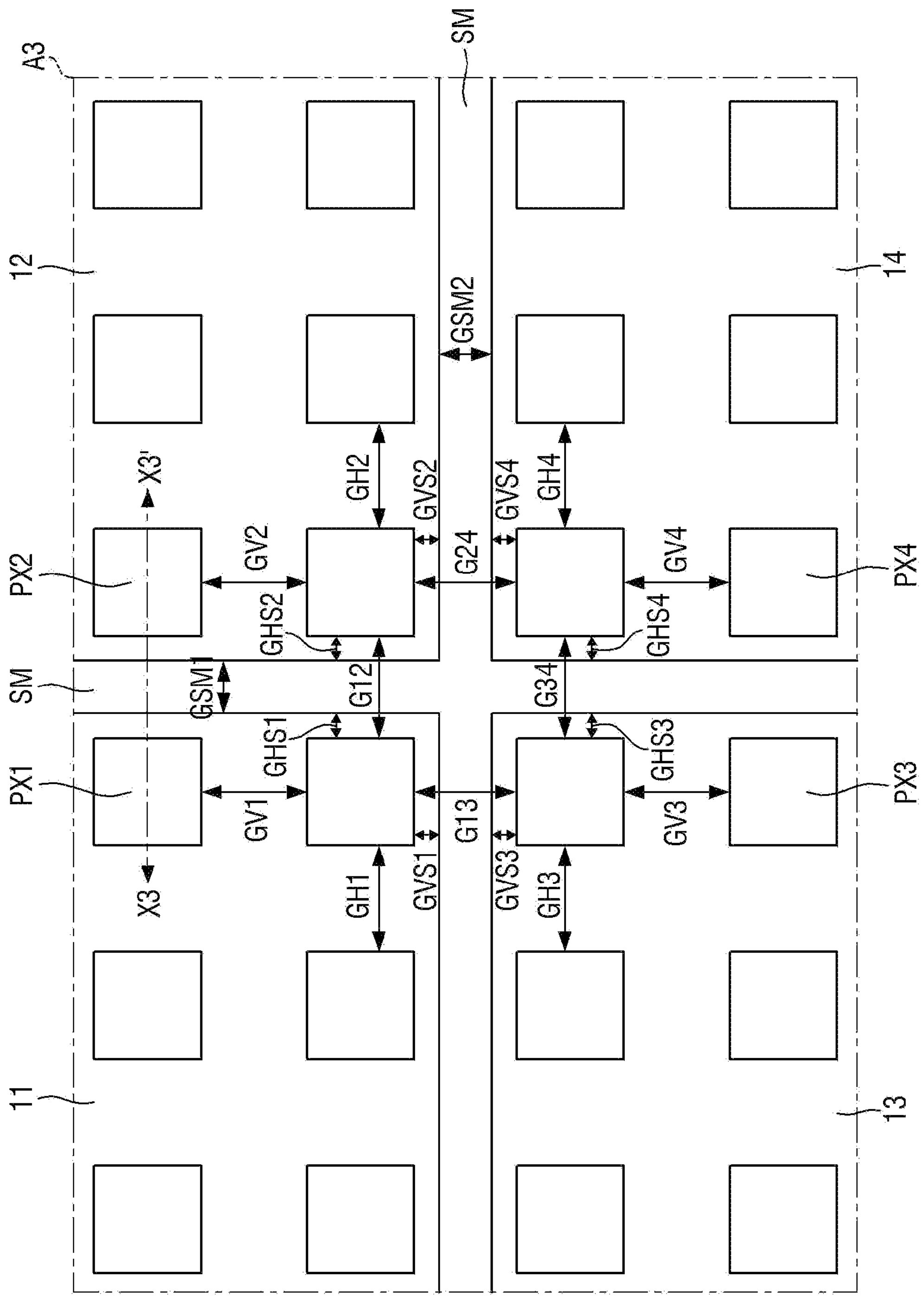
FIG. 14 is an enlarged view of an area A3 of FIG. 13.
Figure 15:
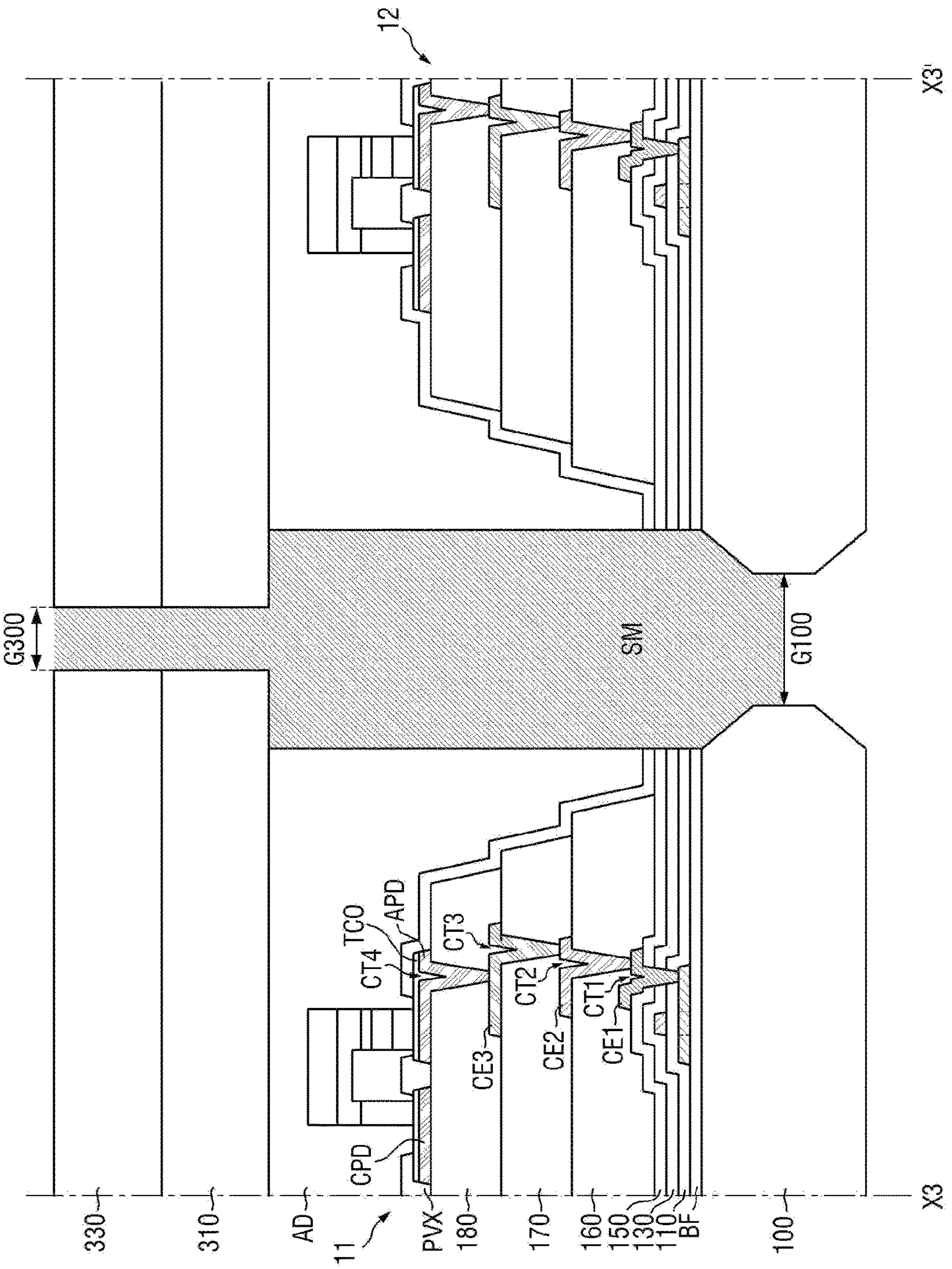
FIG. 15 is a cross-sectional view schematically illustrating a cross section taken along the line X3-X3' of FIG. 14.

FIG. 13 is a plan view schematically illustrating a tiled display using a display device according to one or more embodiments. FIG. 14 is an enlarged view of an area A3 of FIG. 13. FIG. 15 is a cross-sectional view schematically illustrating a cross section taken along the line X3-X3' of FIG. 14.

Referring to FIGS. 13 to 15, a tiled display TD may include a plurality of display devices 10, a connecting portion SM, and a front cover 300. For convenience of explanation, according to a relative positional relationship of each of the plurality of display devices 10 illustrated in FIG. 13, a display device 10 positioned at an upper left is referred to as a 'first display device 11', a display device 10 positioned at an upper right is referred to as a 'second display device 12', a display device 10 positioned at a lower left is referred to as a 'third display device 13', and a display device 10 positioned at a lower right is referred to as a 'fourth display device 14'. Although it is illustrated in FIG. 13 that the tiled display device 10 includes four display devices 10 of the first display device 11, the second display device 12, the third display device 13, and the fourth display device 14, the number of display devices 10 that the tiled display TD may include is not limited thereto. In the present specification, the tiled display TD may be referred to as a tiled display device.

The plurality of display devices 11, 12, 13, and 14 may be arranged in a grid shape. The plurality of display devices 11, 12, 13, and 14 may be arranged in a matrix form in M (M is a positive integer) number of rows and N (N is a positive integer) number of columns. Although it is illustrated in FIG. 13 that the first display device 11 and the second display device 12 are adjacent to each other in the first direction DR1, the first display device 11 and the third display device 13 are adjacent to each other in the second direction DR2, the third display device 13 and the fourth display device 14 are adjacent to each other in the first direction DR1, and the second display device 12 and the fourth display device 14 are adjacent to each other in the second direction DR2, the arrangement of the plurality of display devices constituting the tiled display TD is not limited thereto.

That is, the number and arrangement of display devices in the tiled display TD may be determined according to a size of each of the display device 10 and the tiled display TD and a shape of the tiled display TD. Hereinafter, for convenience of explanation, it will be mainly described that the tiled display TD includes four display devices and each of the plurality of display devices 11, 12, 13, and 14 is disposed in two rows and two columns.

The plurality of display devices 11, 12, 13, and 14 constituting the tiled display TD may have the same size, but are not limited thereto. For example, the plurality of display devices 11, 12, 13, and 14 may have different sizes.

Each of the plurality of display devices 11, 12, 13, and 14 may have a rectangular shape including long sides and short sides. The plurality of display devices 11, 12, 13, and 14 may be disposed with long sides or short sides connected to each other. Some or all of the plurality of display devices 11, 12, 13, and 14 may be disposed at an edge of the tiled display TD and form one side of the tiled display TD. At least one display device 10 of the plurality of display devices 11, 12, 13, and 14 may be disposed on at least one corner of the tiled display TD, and may form two adjacent sides of the tiled display TD. At least one display device of the plurality of display devices 11, 12, 13, and 14 may be surrounded by other display devices.

Each of the plurality of display devices 11, 12, 13, and 14 may be substantially the same as the display device 10 described with reference to FIG. 1. Therefore, a description of each of the plurality of display devices 11, 12, 13, and 14 will be omitted.

The connecting portion SM may include a coupling member or an adhesive member. In this case, the plurality of display devices 11, 12, 13, and 14 may be connected to each other through the coupling member or then adhesive member of the connecting portion SM. The connecting portion SM may be disposed between the first display device 11 and the second display device 12, between the first display device 11 and the third display device 13, and between the second display device 12 and the fourth display device 14, and between the third display device 13 and the fourth display device 14.

Referring to FIG. 14, the connecting portion SM may have a planar shape of a cross or a plus sign at a central region of the tiled display TD in which the first display device 11, the second display device 12, the third display device 13, and the fourth display device 14 are adjacent to each other. The connecting portion SM may be disposed between the first display device 11 and the second display device 12, between the first display device 11 and the third display device 13, and between the second display device 12 and the fourth display device 14, and between the third display device 13 and the fourth display device 14.

The first display device 11 may include first pixels PX1 arranged in a matrix form in a 'row direction (a horizontal direction with respect to FIG. 14)' and a 'column direction (a vertical direction with respect to FIG. 14)' crossing the row direction to display an image. The second display device 12 may include second pixels PX2 arranged in a matrix form in the row direction and the column direction to display an image. The third display device 13 may include third pixels PX3 arranged in a matrix form in the row direction and the column direction to display an image. The fourth display device 14 may include fourth pixels PX4 arranged in a matrix form in the row direction and the column direction to display an image. Because the first pixel PX1, the second pixel PX2, the third pixel PX3, and the fourth pixel PX4 are substantially the same as the pixel PX of the display device 10 described above, a detailed description of structures of the first pixel PX1, the second pixel PX2, the third pixel PX3, and the fourth pixel PX4 will be omitted.

A minimum distance between the first pixels PX1 adjacent to each other in the first direction DR1 may be defined as a first horizontal separation distance GH1, and a minimum distance between the second pixels PX2 adjacent to each other in the first direction DR1 may be defined as a second horizontal separation distance GH2. The first horizontal separation distance GH1 and the second horizontal separation distance GH2 may be substantially the same.

The connecting portion SM may be disposed between the first pixel PX1 and the second pixel PX2 adjacent to each other in the row direction. A minimum distance G12 between the first pixel PX1 and the second pixel PX2 adjacent to each other in the row direction may be a sum of a minimum distance GHS1 between the first pixel PX1 and the connecting portion SM in the row direction, a minimum distance GHS2 between the second pixel PX2 and the connecting portion SM in the row direction, and a width GSM1 of the connecting portion SM in the row direction.

The minimum distance G12 between the first pixel PX1 and the second pixel PX2 adjacent to each other in the row direction, the first horizontal separation distance GH1, and the second horizontal separation distance GH2 may be substantially the same. To this end, the minimum distance GHS1 between the first pixel PX1 and the connecting portion SM in the row direction may be smaller than the first horizontal separation distance GH1, and the minimum distance GHS2 between the second pixel PX2 and the connecting portion SM in the row direction may be smaller than the second horizontal separation distance GH2. In addition, the width GSM1 of the connecting portion SM in the row direction may be smaller than the first horizontal separation distance GH1 or the second horizontal separation distance GH2.

A minimum distance between the third pixels PX3 adjacent to each other in the row direction may be defined as a third horizontal separation distance GH3, and a minimum distance between the fourth pixels PX4 adjacent to each other in the row direction may be defined as a fourth horizontal separation distance GH4. The third horizontal separation distance GH3 and the fourth horizontal separation distance GH4 may be substantially the same.

The connecting portion SM may be disposed between the third pixel PX3 and the fourth pixel PX4 adjacent to each other in the row direction. A minimum distance G34 between the third pixel PX3 and the fourth pixel PX4 adjacent to each other in the row direction may be a sum of a minimum distance GHS3 between the third pixel PX3 and the connecting portion SM in the row direction, a minimum distance GHS4 between the fourth pixel PX4 and the connecting portion SM in the row direction, and a width GSM1 of the connecting portion SM in the row direction.

The minimum distance G34 between the third pixel PX3 and the fourth pixel PX4 adjacent to each other in the row direction, the third horizontal separation distance GH3, and the fourth horizontal separation distance GH4 may be substantially the same. To this end, the minimum distance GHS3 between the third pixel PX3 and the connecting portion SM in the row direction may be smaller than the third horizontal separation distance GH3, and the minimum distance GHS4 between the fourth pixel PX4 and the connecting portion SM in the row direction may be smaller than the fourth horizontal separation distance GH4. In addition, the width GSM1 of the connecting portion SM in the row direction may be smaller than the third horizontal separation distance GH3 or the fourth horizontal separation distance GH4.

A minimum distance between the first pixels PX1 adjacent to each other in the column direction may be defined as a first vertical separation distance GV1, and a minimum distance between the third pixels PX3 adjacent to each other in the column direction may be defined as a third vertical separation distance GV3. The first vertical separation distance GV1 and the third vertical separation distance GV3 may be substantially the same.

The connecting portion SM may be disposed between the first pixel PX1 and the third pixel PX3 adjacent to each other in the column direction. A minimum distance G13 between the first pixel PX1 and the third pixel PX3 adjacent to each other in the column direction may be a sum of a minimum distance GVS1 between the first pixel PX1 and the connecting portion SM in the column direction, a minimum distance GVS3 between the third pixel PX3 and the connecting portion SM in the column direction, and a width GSM2 of the connecting portion SM in the column direction.

The minimum distance G13 between the first pixel PX1 and the third pixel PX3 adjacent to each other in the column direction, the first vertical separation distance GV1, and the third vertical separation distance GV3 may be substantially the same. To this end, the minimum distance GVS1 between the first pixel PX1 and the connecting portion SM in the column direction may be smaller than the first vertical separation distance GV1, and the minimum distance GVS3 between the third pixel PX3 and the connecting portion SM in the column direction may be smaller than the third vertical separation distance GV3. In addition, the width GSM2 of the connecting portion SM in the column direction may be smaller than the first vertical separation distance GV1 or the third vertical separation distance GV3.

A minimum distance between the second pixels PX2 adjacent to each other in the column direction may be defined as a second vertical separation distance GV2, and a minimum distance between the fourth pixels PX4 adjacent to each other in the column direction may be defined as a fourth vertical separation distance GV4. The second vertical separation distance GV2 and the fourth vertical separation distance GV4 may be substantially the same.

The connecting portion SM may be disposed between the second pixel PX2 and the fourth pixel PX4 adjacent to each other in the column direction. A minimum distance G24 between the second pixel PX2 and the fourth pixel PX4 adjacent to each other in the column direction may be a sum of a minimum distance GVS2 between the second pixel PX2 and the connecting portion SM in the column direction, a minimum distance GVS4 between the fourth pixel PX4 and the connecting portion SM in the column direction, and a width GSM2 of the connecting portion SM in the column direction.

The minimum distance G24 between the second pixel PX2 and the fourth pixel PX4 adjacent to each other in the column direction, the second vertical separation distance GV2, and the fourth vertical separation distance GV4 may be substantially the same. To this end, the minimum distance GVS2 between the second pixel PX2 and the connecting portion SM in the column direction may be smaller than the second vertical separation distance GV2, and the minimum distance GVS4 between the fourth pixel PX4 and the connecting portion SM in the column direction may be smaller than the fourth vertical separation distance GV4. In addition, the width GSM2 of the connecting portion SM in the column direction may be smaller than the second vertical separation distance GV2 or the fourth vertical separation distance GV4.

In order to prevent the connecting portion SM from being visually recognized between the images displayed by the plurality of display devices 11, 12, 13, and 14, the minimum distance between the pixels PX of the display devices 10 adjacent to each other may be substantially the same as the minimum distance between the pixels PX of each of the display devices 10, as illustrated in FIG. 14.

Referring to FIG. 15, a plurality of front covers 300 may be disposed on each of the plurality of display devices 11, 12, 13, and 14. For convenience of explanation, the front cover 300 disposed on the first display device 11 is referred to as a 'first front cover', the front cover 300 disposed on the second display device 12 is referred to as a 'second front cover', the front cover 300 disposed on the third display device 13 is referred to as a 'third front cover', and the front cover 300 disposed on the fourth display device 14 is referred to as a 'fourth front cover'. The plurality of display devices 11, 12, 13, and 14 and the plurality of front covers 300 corresponding thereto may be adhered to each other through the adhesive member AD.

It is illustrated in FIG. 15 that an arrangement structure of the first display device 11 and the second display device 12 and the first front cover and the second front cover corresponding thereto. An arrangement structure of the third display device 13 and the third front cover and the fourth display device 14 and the fourth front cover is the same as the arrangement structure of the first display device 11 and the second display device 12 and the first front cover and the second front cover corresponding thereto. Therefore, hereinafter, the first front cover and the second front cover will be mainly described, and detailed descriptions of the third front cover and the fourth front cover will be omitted.

The first front cover may be disposed on the first display device 11 and further protrude than the substrate 100 of the first display device 11. Therefore, a gap G100 between the substrate 100 of the first display device 11 and the substrate 100 of the second display device 12 may be greater than a gap G300 between the first front cover and the second front cover.

Each of the plurality of front covers 300 may include a light transmittance adjusting layer 310 and an anti-glare layer 330.

As described above, each of the plurality of front covers 300 may be adhered to the corresponding display device 10 by the adhesive member AD. The adhesive member AD may be a transparent adhesive member capable of transmitting light. For example, the adhesive member AD may be an optically clear adhesive film or an optically clear resin.

The light transmittance adjusting layer 310 may be disposed on the adhesive member AD. The light transmittance adjusting layer 310 may be designed to reduce a transmittance of external light or light reflected from the first display device 11 and the second display device 12. In addition, because the front cover 300 further protrudes than the substrate 100 as described above, the light transmittance adjusting layer 310 included in the front cover 300 may further protrude than the substrate 100. Accordingly, the gap G100 between the substrate 100 of the first display device 11 and the substrate 100 of the second display device 12 may be prevented from being visually recognized from the outside.

The anti-glare layer 330 may be disposed on the light transmittance adjusting layer 310. The anti-glare layer 330 may be designed to diffusely reflect external light in order to prevent deterioration in image visibility caused by external light being reflected as it is. Accordingly, a contrast ratio of the images displayed by the first display device 11 and the second display device 12 may be increased due to the anti-glare layer 330.

The anti-glare layer 330 may be implemented as a polarizing plate, and the light transmittance adjusting layer 310 may be implemented as a phase delay layer, but one or more embodiments of the present disclosure are not limited thereto.

Hereinafter, a driving method of the tiled display TD according to one or more embodiments will be described.

Figure 16:
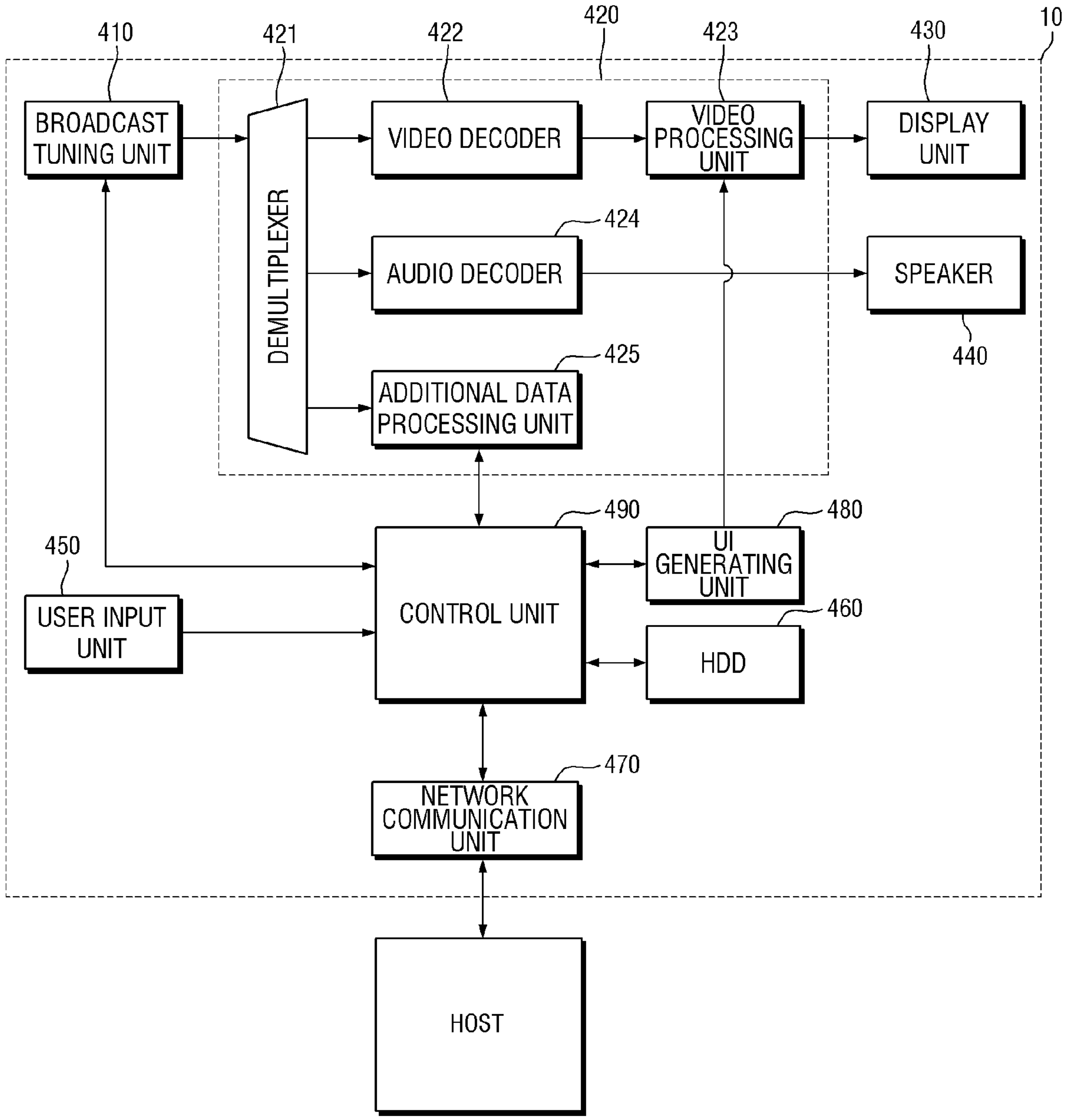
FIG. 16 is a block diagram illustrating a structure of a tiled display according to one or more embodiments.
Figure 17:
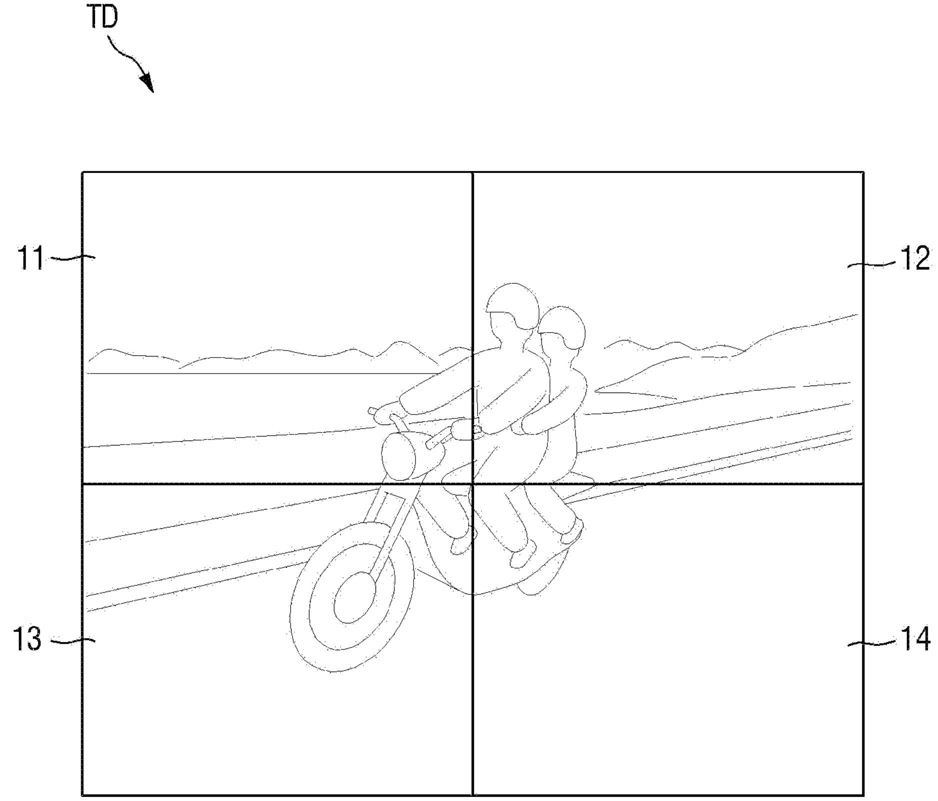
FIG. 17 is a view illustrating a state in which the tiled display using the display device according to one or more embodiments is driven.

FIG. 16 is a block diagram illustrating a structure of a tiled display according to one or more embodiments. FIG. 17 is a view illustrating a state in which the tiled display using the display device according to one or more embodiments is driven.

Referring to FIGS. 16 and 17, the tiled display TD according to one or more embodiments may include a host system HOST, and a broadcast tuning unit 410, a signal processing unit 420, a display unit 430, a speaker 440, a user input unit 450, an HDD 460, a network communication unit 470, a UI generating unit 480, and a control unit 490 included in each of the plurality of display devices 11, 12, 13, and 14 of FIG. 13. FIG. 16 illustrates the host system HOST and the first display device 11.

The host system HOST may be implemented as any one of a television system, a home theater system, a set-top box, a navigation system, a DVD player, a Blu-ray player, a personal computer (PC), a mobile phone system, and/or a tablet.

A user's command may be input to the host system HOST in various formats. For example, a command by a user's touch input may be input to the host system HOST. Alternatively, a user's command may be input to the host system HOST by a keyboard input or a button input of a remote controller.

The host system HOST may receive original video data corresponding to an original image from the outside. The host system HOST may divide the original video data by the number of display devices 10. For example, the host system HOST may divide the original video data into first video data corresponding to a first image, second video data corresponding to a second image, third video data corresponding to a third image, and fourth video data corresponding to a fourth image to correspond to the first display device 11, the second display device 12, the third display device 13, and the fourth display device 14 of FIG. 13. The host system HOST may transmit the first video data to the first display device 11, transmit the second video data to the second display device 12, transmit the third video data to the third display device 13, and transmit the fourth video data to the fourth display device 14 of FIG. 13.

The first display device 11 may display the first image according to the first video data, the second display device 12 may display the second image according to the second video data, the third display device 13 may display the third image according to the third video data, and the fourth display device 14 may display the fourth image according to the fourth video data. Accordingly, the user may view an original image in which the first to fourth images displayed on the first to fourth display devices 11, 12, 13, and 14 are combined as illustrated in FIG. 17.

Each of the plurality of display devices 11, 12, 13, and 14 constituting the tiled display TD may further include a broadcast tuning unit 410, a signal processing unit 420, a display unit 430, a speaker 440, a user input unit 450, an HDD 460, a network communication unit 470, a UI generating unit 480, and a control unit 490. The components included in the plurality of display devices 11, 12, 13, and 14 are substantially the same. Therefore, hereinafter, for convenience of explanation, the components included in the first display device 11 will be mainly described, and the description of the components included in the second display device 12, the third display device 13, and the fourth display device 14 will be omitted.

The broadcast tuning unit 410 may receive a broadcast signal of a corresponding channel through an antenna by tuning a desired channel frequency (e.g., a predetermined channel frequency) under the control of the control unit 490. The broadcast tuning unit 410 may include a channel detection module and an RF demodulation module.

A broadcast signal demodulated by the broadcast tuning unit 410 is processed by the signal processing unit 420 and output to the display unit 430 and the speaker 440. Here, the signal processing unit 420 may include a demultiplexer 421, a video decoder 422, a video processing unit 423, an audio decoder 424, and an additional data processing unit 425.

The demultiplexer 421 separates the demodulated broadcast signal into a video signal, an audio signal, and additional data. The separated video signal, audio signal, and additional data are restored by the video decoder 422, the audio decoder 424, and the additional data processing unit 425, respectively. In this case, the video decoder 422, the audio decoder 424, and the additional data processing unit 425 restore the separated video signal, audio signal, and additional data in a decoding format corresponding to an encoding format when the broadcast signal is transmitted.

On the other hand, the decoded video signal is converted by the video processing unit 423 to be suitable for a vertical frequency, a resolution, an aspect ratio, and the like that meet an output standard of the display unit 430, and the decoded audio signal is output to the speaker 440.

The display unit 430, which is a device for displaying an image, includes the pixels PX, the driving unit, and the like.

The user input unit 450 may receive a signal transmitted by the host system HOST. The user input unit 450 may be provided so that data for selection and input of the user with respect to commands related to communication with other display devices 12 to 14 as well as data related to selection of a channel transmitted by the host system HOST and selection and operation of a user interface (UI) may be input.

The HDD 460 stores various software programs including OS programs, recorded broadcast programs, videos, photos, and/or other data, and may be formed of a storage medium such as a hard disk or non-volatile memory.

The network communication unit 470 is for short-distance communication with the host system HOST and other display devices 12 to 14, and may be implemented as a communication module including an antenna pattern capable of implementing mobile communication, data communication, Bluetooth, RF, Ethernet, and/or the like.

The network communication unit 470 may transmit and receive a wireless signal with at least one of a base station, an external terminal, and a server on a mobile communication network constructed according to technical standards or communication methods for mobile communication (e.g., Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), 5G, etc.) through an antenna pattern to be described later.

The network communication unit 470 may transmit and receive a wireless signal in a communication network according to wireless Internet technologies through an antenna pattern to be described later. Examples of the wireless Internet technology include, for example, Wireless LAN (WLAN), Wireless-Fidelity (Wi-Fi), Wireless Fidelity (Wi-Fi) Direct, Digital Living Network Alliance (DLNA), Wireless Broadband (WiBro), World Interoperability for Microwave Access (WiMAX), High Speed Downlink Packet Access (HSDPA), High Speed Uplink Packet Access (HSUPA), Long Term Evolution (LTE), Long Term Evolution-Advanced (LTE-A), and the like, and the antenna pattern transmits and receives data according to at least one wireless Internet technology within a range including Internet technologies not listed above.

The UI generating unit 480 generates a UI menu for communication with the host system HOST and other display devices 12 to 14, and may be implemented by an algorithm code and an OSD IC. The UI menu for communication with the host system HOST and other display devices 12 to 14 may be a menu for designating a counterpart digital TV with which communication is desired and selecting a desired function.

The control unit 490 performs overall control of the first display device 11, and performs communication control of the host system HOST and the second to fourth display devices 12, 13, and 14, and may be implemented by a microcontroller unit (MCU) in which a corresponding algorithm code for control is stored and the stored algorithm code is executed.

The control unit 490 performs control so that the corresponding control commands and data are transmitted to the host system HOST and the second to fourth display devices 12, 13, and 14 through the network communication unit 470 according to the input and selection of the user input unit 450. When control commands and data (e.g., predetermined control commands and data) are input from the host system HOST and the second to fourth display devices 12, 13, and 14, the control unit 490 performs an operation according to the corresponding control command.

It should be understood, however, that the aspects and features of embodiments of the present disclosure are not restricted to the one set forth herein. The above and other aspects of the present disclosure will become more apparent to one of ordinary skill in the art to which the present disclosure pertains by referencing the claims, with functional equivalents thereof to be included therein.

What is claimed is:

1. A display device comprising:
- a substrate having a first surface on which a light emitting element is located, a second surface on which a driving unit for driving the light emitting element is located, the second surface being opposite the first surface, and a first side surface between the first surface and the second surface;
- a first pad on the first surface of the substrate and electrically connected to the light emitting element;
- a second pad on the second surface of the substrate and electrically connected to the driving unit; and
- a side wiring on the first surface, the second surface, and the first side surface of the substrate to electrically connect the first pad and the second pad,
- wherein the side wiring comprises a first side wiring and a second side wiring spaced from each other, and
- wherein the first pad comprises:
  - a first contact portion in contact with the first side wiring; and
  - a second contact portion on one side of the first contact portion and in contact with the second side wiring, and
- wherein the first contact portion and the second contact portion are electrically connected to each other.

2. The display device of claim 1, further comprising:
- a top connection line between the first surface of the substrate and the first pad and electrically connecting the first pad and the light emitting element; and
- an upper insulating layer between the top connection line and the first pad,
- wherein the first pad is in contact with the top connection line through a plurality of contact holes penetrating through the upper insulating layer.

3. The display device of claim 2, wherein the first pad further comprises a first inspection portion on an other side of the first contact portion and not overlapping the side wiring.

4. The display device of claim 3, wherein the second pad comprises:
- a third contact portion in contact with the first side wiring; and
- a fourth contact portion on one side of the third contact portion and in contact with the second side wiring.

5. The display device of claim 4, further comprising a bottom connection line between the second surface of the substrate and the second pad and electrically connecting the second pad and the driving unit,
- wherein the second pad is in contact with the bottom connection line.

6. The display device of claim 5, wherein the second pad further comprises a second inspection portion on an other side of the third contact portion and not overlapping the side wiring.

7. The display device of claim 1, wherein the substrate further comprises:
- a first chamfered surface extending from one side of the first surface; and
- a second chamfered surface extending from one side of the second surface,
- wherein the first side surface connects the first chamfered surface and the second chamfered surface.

8. The display device of claim 7, wherein the side wiring is on the first surface, the first chamfered surface, the first side surface, the second chamfered surface, and the second surface.

9. The display device of claim 8, wherein the side wiring comprises silver (Ag).

10. The display device of claim 1, wherein the light emitting element is a flip chip type micro light emitting diode element.

11. A display device comprising:
- a substrate having a first surface on which a light emitting element is located and a second surface on which a driving unit for driving the light emitting element is located, the second surface being opposite the first surface;
- a first upper pad electrode on the first surface of the substrate and electrically connected to the light emitting element;
- a first insulating layer on the first upper pad electrode and having a first opening and a second opening exposing the first upper pad electrode;
- a first lower pad electrode on the second surface of the substrate and electrically connected to the driving unit;
- a second insulating layer on the first lower pad electrode and having a third opening and a fourth opening exposing the first lower pad electrode; and
- a side wiring electrically connecting the first upper pad electrode and the first lower pad electrode, wherein the side wiring comprises:

a first side wiring in contact with a first portion of the first upper pad electrode exposed by the first opening and a portion of the first lower pad electrode exposed by the third opening; and a second side wiring spaced from the first side wiring and in contact with a second portion of the first upper pad electrode exposed by the second opening and a portion of the first lower pad electrode exposed by the fourth opening, and wherein the first portion and the second portion are electrically connected to each other.

12. The display device of claim 11, further comprising an overcoat layer covering the first side wiring and the second side wiring, wherein the overcoat layer is in contact with the first insulating layer in a separation space between the first side wiring and the second side wiring on the first surface of the substrate.

13. The display device of claim 12, wherein the overcoat layer is in contact with the second insulating layer in a separation space between the first side wiring and the second side wiring on the second surface.

14. The display device of claim 13, wherein the side wiring comprises silver (Ag), and wherein the overcoat layer comprises one or more selected from among acrylic resin, an epoxy resin, a phenolic resin, a polyamide resin, and a polyimide resin.

15. The display device of claim 11, wherein the substrate further comprises:

a first chamfered surface extending from one side of the first surface;

a second chamfered surface extending from one side of the second surface; and a first side surface connecting the first chamfered surface and the second chamfered surface, and wherein the side wiring is on the first surface, the first chamfered surface, the first side surface, the second chamfered surface, and the second surface.

16. A tiled display device comprising:

a plurality of display devices and a connecting portion between the plurality of display devices, wherein a first display device of the plurality of display devices comprises:

a substrate having a first surface on which a light emitting element is located, a second surface on which a driving unit for driving the light emitting element is located, the second surface being opposite the first surface, and a first side surface between the first surface and the second surface;

a first pad on the first surface of the substrate and electrically connected to the light emitting element;

a second pad on the second surface of the substrate and electrically connected to the driving unit; and a side wiring on the first surface, the second surface, and the first side surface of the substrate to electrically connect the first pad and the second pad, wherein the side wiring comprises a first side wiring and a second side wiring spaced from each other, and wherein the first pad comprises:

a first inspection portion that does not overlap the side wiring;

a first contact portion on one side of the first inspection portion and in contact with the first side wiring; and a second contact portion on one side of the first contact portion and in contact with the second side wiring.

17. The tiled display device of claim 16, wherein the light emitting element is a flip chip type micro light emitting diode element.

18. The tiled display device of claim 16, wherein the substrate comprises glass.

19. The tiled display device of claim 16, wherein the first display device comprises:

a bottom connection line on the second surface of the substrate and connected to the second pad; and a flexible film connected to the bottom connection line through a conductive adhesive member.

20. The tiled display device of claim 16, wherein the plurality of display devices is arranged in a matrix form in M rows and N columns, wherein M and N are positive integers.

* * * * *